United States Patent
Dodoc

(10) Patent No.: US 7,359,036 B2
(45) Date of Patent: Apr. 15, 2008

(54) IMAGING SYSTEM, IN PARTICULAR FOR A MICROLITHOGRAPHIC PROJECTION EXPOSURE APPARATUS

(75) Inventor: Aurelian Dodoc, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/441,482

(22) Filed: May 26, 2006

(65) Prior Publication Data

US 2006/0268253 A1 Nov. 30, 2006

(30) Foreign Application Priority Data

May 27, 2005 (DE) .................... 10 2005 024 290

(51) Int. Cl.
*G03B 27/54* (2006.01)
*G03B 27/42* (2006.01)

(52) U.S. Cl. ........................................ 355/67; 355/53

(58) Field of Classification Search .................. 355/52, 355/53, 55, 67; 359/626–627, 649–651
See application file for complete search history.

(56) References Cited

U.S. PATENT DOCUMENTS

| | | | |
|---|---|---|---|
| 5,260,832 A | 11/1993 | Togino et al. | |
| 5,636,066 A | 6/1997 | Takahashi | |
| 5,903,400 A | 5/1999 | Endo | |
| 6,813,098 B2 | 11/2004 | Mercado | |
| 6,816,236 B2 | 11/2004 | Otomo | |
| 6,831,731 B2 * | 12/2004 | Omura et al. ................ | 355/67 |
| 6,863,403 B2 | 3/2005 | Mercado et al. | |
| 2003/0011755 A1 * | 1/2003 | Omura et al. ................ | 355/67 |

FOREIGN PATENT DOCUMENTS

| | | |
|---|---|---|
| EP | 1 061 396 | 12/2000 |
| EP | 1 191 378 A1 | 3/2002 |
| EP | 1 191 387 A1 | 3/2002 |
| EP | 1 336 887 A1 | 9/2003 |
| JP | 06 265789 A | 9/1994 |
| JP | 2002-072080 | 3/2002 |

(Continued)

OTHER PUBLICATIONS

Besenmatter, W., "Analysis of primary characteristics of aspheric surfaces with the aid of the Delano-Diagram," OPTIK, vol. 51, No. 4, 1978, pp. 385-396.

(Continued)

*Primary Examiner*—Henry Hung Nguyen
(74) *Attorney, Agent, or Firm*—Fish & Richardson P.C.

(57) ABSTRACT

The invention concerns imaging systems, in particular for a microlithographic projection exposure apparatus, for imaging a mask which can be positioned in an object plane of the imaging system on to a photosensitive layer which can be positioned in an image plane of the imaging system. An imaging system according to the invention comprises: an object plane-side subsystem which produces a first intermediate image with an object plane-side imaging scale $\beta_o$, at least one further subsystem which produces a further intermediate image between the first intermediate image and the image plane, and an image plane-side subsystem which images the further intermediate image into the image plane with an image plane-side imaging scale $\beta_i$, wherein the condition $0.75 \leq \beta_o * \beta_i \leq 1.25$ is satisfied.

22 Claims, 12 Drawing Sheets

FOREIGN PATENT DOCUMENTS

| JP | 2003-185923 | 7/2003 |
| JP | 2004-086110 | 3/2004 |
| JP | 2006-267383 | 10/2006 |

OTHER PUBLICATIONS

W. Besenmatter: 'Analyse der primären Wirkung asphärischer Flächen mit Hilfe des Delano-Diagramms', ['Analysis of the primary action of aspherical surfaces by means of the Delano diagram'], OPTIK, vol. 51, No. 4, 1978, pp. 385-396.

Williamson, D., Catadioptric microlithographic reduction lenses, JOSA, 1994, vol. 22, p. 428.

Glatzel, E., New Developments in Photographic Objectives, Vortrag ICO 8, Reading, 1969.

* cited by examiner

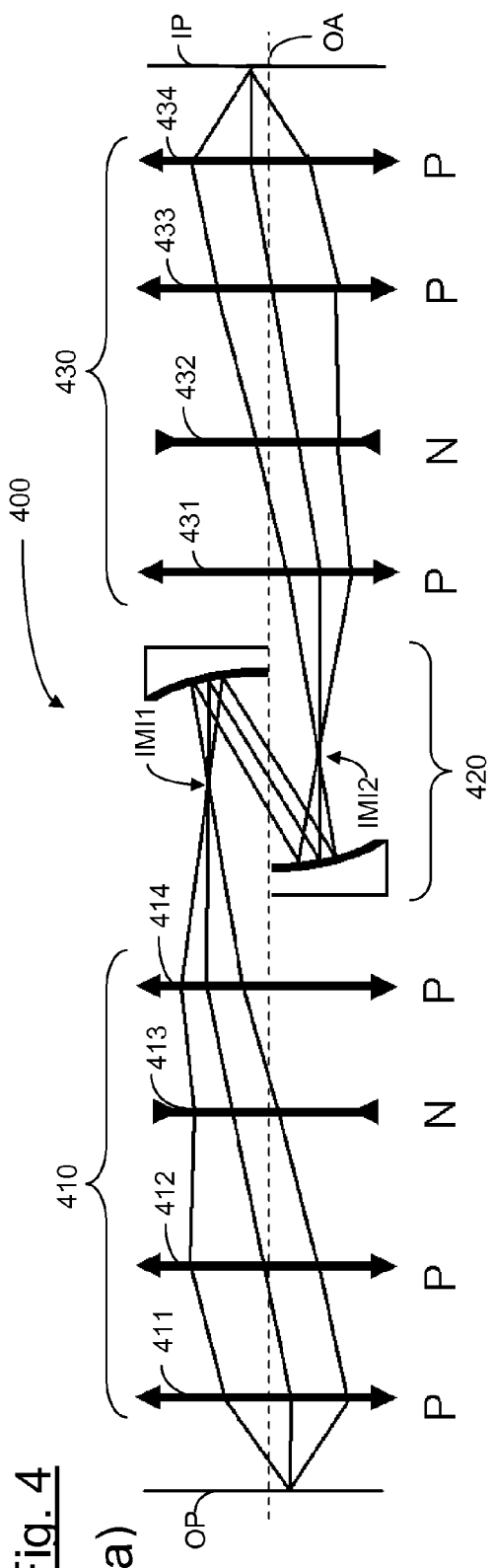
Fig. 4

IMAGING SYSTEM, IN PARTICULAR FOR A MICROLITHOGRAPHIC PROJECTION EXPOSURE APPARATUS

BACKGROUND OF THE INVENTION

1. Field of the Invention

The invention concerns an imaging system and in particular a projection objective of a microlithographic projection exposure apparatus.

2. State of the Art

Microlithography is used for the production of microstructured components such as for example integrated circuits or LCDs. The microlithography process is carried out in what is known as a projection exposure apparatus comprising an illumination system and a projection objective. The image of a mask (=reticule) illuminated by means of the illumination system is in that case projected by means of the projection objective on to a substrate (for example a silicon wafer) which is coated with a photosensitive layer (photoresist) and which is arranged in the image plane of the projection objective, in order to transfer the mask structure on to the photosensitive coating of the substrate.

Particularly in the early days of microlithography, so-called 'copy systems' with an imaging scale β of close to 1 were used as the projection objectives. Designs by way of example of such 'copy systems' are set forth hereinafter without laying any claim to completeness and without a definitive appreciation thereof, as state of the art.

JP 2003185923 A discloses such a projection objective which is designed for a working wavelength of 365 nm and which has two catadioptric subsystems K1 and K3 with mutually displaced optical axes, between which an intermediate image is produced. Each of the subobjectives has a concave mirror for correction of image field curvature and a polarisation beam splitter for folding of the optical axis.

JP 2004086110 A discloses a purely refractive projection objective PL which is also designed for a working wavelength of 365 nm and between the lens groups G1 and G2 of which no intermediate image is produced and for which a numerical aperture of NA=0.275 is specified.

In order to do justice to the demands on manufacture of ever smaller structures in the μm range, present projection objectives for microlithography are typically designed in the form of reduction objectives with an imaging scale β of less than 1 and typically β=0.25 or less (for example with β=0.125, β=0.100 etc). That also reduces in particular the demands on the microstructuring of the mask (which depending on the above-mentioned imaging scale is 4 times, 8 times, 10 times etc larger). In order to correct the aberrations which occur in particular in such projection objectives which are of an ever more complex structure, high-resolution reduction objectives typically have a relatively large number of for example 20 or more optical elements such as lenses, mirrors, prisms and so forth.

Catadioptric designs which have both refractive and also reflecting components are particularly wide-spread. Admittedly, in such projection objectives, it is possible to achieve relatively high numerical apertures which can be further increased by means of immersion lithography to values above 1, but the process complication and expenditure in terms of production and adjustment is considerable in regard to the large number of different optical elements which are to be adjusted as precisely as possible relative to each other.

Furthermore, aspheric members are also used in the correction of aberrations, whereby further degrees of freedom are introduced in the optical system in particular without additional lens elements. In that respect it is known in particular that the position of aspherical surfaces in the system substantially influences the mode of action thereof on different kinds of aberration. An inventory of the ranges of action of aspheric members in dependence on the height of the outermost ray emanating from the object center beam and of the main ray is to be found for example in W Besenmatter: 'Analyse der primären Wirkung asphärischer Flächen mit Hilfe des Delano-Diagramms', ['Analysis of the primary action of aspherical surfaces by means of the Delano diagram'], OPTIK, Vol 51, No 4, 1978, pages 385-396.

SUMMARY OF THE INVENTION

The object of the present invention is to provide an alternative design of an imaging system, in particular for a microlithographic projection exposure apparatus, which on the one hand is of a structure which is of utmost simplicity and which is advantageous in terms of production engineering and which on the other hand permits the achievement of relatively high levels of resolution.

That object is attained by the features of the independent claims.

In accordance with the invention an imaging system for imaging a mask which can be positioned in an object plane of the imaging system on to a photosensitive layer which can be positioned in an image plane of the imaging system, comprises an object plane-side subsystem which produces a first intermediate image with an object plane-side imaging scale $\beta_o$;

at least one further subsystem which produces a further intermediate image between the first intermediate image and the image plane; and an image plane-side subsystem which images the further intermediate image into the image plane with an image plane-side imaging scale $\beta_i$;

wherein the condition $0.75 \leq \beta_o * \beta_i \leq 1.25$ is satisfied.

The arrangement according to the invention, in regard to the object plane-side subsystem and the image plane-side subsystem, provides a structure which is mirror image symmetrical substantially (that is to say in the specified limits), in which respect the expression mirror image symmetrical is related to a pupil plane or aperture plane of the imaging system. That symmetry (in the case of a totally symmetrical structure) or 'quasi-symmetry' (in the case of a structure which is approximately symmetrical in accordance with the invention) has the result that substantially similar or even identical optical elements (in particular lenses, mirrors or prisms) can be used in said subsystems, which considerably reduces the complication and expenditure in manufacturing procedure.

At the same time the production of the at least one further intermediate image (and thus the presence of a total of at least two intermediate images in the entire imaging system) permits a structure with effective correction of image field curvature ('Petzval correction'). That is the case in particular because, in the proximity of said intermediate images, because of the beam diameter being comparatively small there, it is possible to achieve effective division or splitting of the beams, which lead to an optical element which is used for the correction of image field curvature such as for example a concave mirror or are reflected by same. That in turn permits the production of even larger image fields with a relatively slight image field curvature (in particular practically 'flat' image fields) and high levels of resolution.

A further advantage achieved by the symmetry or 'quasi-symmetry' according to the invention is that it is already for reasons of symmetry that certain aberrations such as coma or distortion errors can be almost ideally compensated in a simple manner and without the use of further optical correction elements.

In the copy systems presented in accordance with this application, with an overall imaging scale of the imaging system at least close to 1, it is possible to produce comparatively large image fields, which has for example advantages in terms of a simpler and easier scan process, which is to be controlled with fewer adaptation procedures, in wafer production.

In addition, because of the comparatively large image fields which can be achieved (of for example more than 30 mm, in particular about 100 mm), the present invention can be used to good effect in the production of LCD arrangements or FPD arrangements (FPD=flat panel display).

Furthermore the invention can advantageously be used for what is referred to as 'wafer level packaging' in which the entire structure and connecting technology is integrated with wiring of the chips (referred to as 'dies') into the lithography process, in which case the contacts are applied to the entire underside of the devices, that is to say distributed over the entire area. Typically in wafer level packaging, with minimum structure sizes which are less by one to two orders of magnitude in comparison with the IC production process, comparatively large areas (for example two to four chips of a size of 26 mm*33 mm) are exposed in one step (that is to say in what is to referred to as the step-and-repeat mode). The present invention is therefore advantageous in regard to those uses because of the large image fields which can be achieved according to the invention.

In accordance with a preferred embodiment in the imaging system according to the invention for the object plane-side imaging scale and the image plane-side imaging scale the condition $0.85 \leq \beta_o * \beta_i \leq 1.15$, preferably $0.95 \leq \beta_o * \beta_i \leq 1.05$, still more preferably $\beta_o * \beta_i = 1$ is fulfilled.

In addition for a total imaging scale $\beta$ preferably the condition $0.75 \leq \beta \leq 1.25$, preferably $0.85 \leq \beta \leq 1.15$, further preferably $0.95 \leq \beta \leq 1.05$ and still more preferably $\beta = 1$ is fulfilled.

In accordance with a preferred embodiment the further subsystem has at least one concave mirror.

In accordance with a preferred embodiment the imaging system according to the invention is substantially telecentric at the object plane side and/or the image plane side. Particularly preferably the imaging system is therefore telecentric at the object plane side and the image plane side (referred to for brevity as 'two-sided' or 'doubled' telecentric). This means that the entry pupil (in the case of object plane-side telecentry) or the exit pupil (in the case of image plane-side telecentry) or both (in the case of doubled telecentry) are 'at infinity', that is to say therefore the respective principal rays extend parallel to the optical axis. That configuration has the advantage that, even in the case of an imaging system which is not precisely set (with object or image surfaces which are not arranged exactly in the object or image planes respectively for example as a consequence of adjustment errors), the imaging is admittedly out-of-focus but is nonetheless true to scale. For example lines which are to be imaged are admittedly shown out-of-focus as a consequence of the focus error in the image plane, but nonetheless are at the correct positions (both relative to each other and also relative to the overall imaging system), which is of particularly great significance precisely when imaging microstructures.

In accordance with a preferred embodiment all subsystems are arranged on a common optical axis.

In accordance with a preferred embodiment the object plane and the image plane are arranged in mutually parallel relationship.

In accordance with a preferred embodiment the further subsystem forms the first intermediate image in the second intermediate image.

In accordance with a preferred embodiment the image-side numerical aperture (NA) is greater than 0.6, preferably greater than 0.8, still more preferably greater than 1.0.

In accordance with a preferred embodiment the imaging system is of substantially mirror image symmetrical configuration in relation to a pupil plane of the imaging system.

In accordance with a preferred embodiment the imaging system produces in the image plane an image field of a diameter of at least 30 mm, preferably at least 50 mm, still more preferably at least 100 mm.

In accordance with a further aspect of the invention an imaging system for imaging a mask which can be positioned in an object plane of the imaging system on to a photosensitive layer which can be positioned in an image plane of the imaging system, comprises a first dioptric group in front of a pupil plane of overall positive refractive power; and at least one second dioptric group after a pupil plane of overall positive refractive power;

wherein the imaging system has an imaging scale $\beta'$, for which the condition $0.50 \leq \beta' \leq 1.50$ is fulfilled;

wherein the imaging system is of a telecentric configuration at the object plane side and the image plane side; and wherein there is provided at least one aspheric lens surface for which the condition $|\sin \sigma_{max}/\sin \sigma_o| > 0.4$ is fulfilled, wherein $\sigma_{max}$ gives the maximum angle of inclination of the rays which emanate from said lens surface to the next lens surface and wherein $\sigma_o$ gives the angle of inclination of that edge ray which emanates from the object point on the optical axis to the optical axis.

That configuration provides that particularly effective correction of aberration phenomena is achieved in the symmetrical or quasi-symmetrical systems according to the invention, in which respect in particular account is firstly taken of the fact that, in such symmetrical and quasi-symmetrical systems, the uneven aberrations such as distortion, coma and CHV (=chromatic magnification difference) are compensated internally between the lens groups in front of the plane of symmetry and the lens groups after the plane of symmetry and only the other aberrations are to be corrected. Those remaining aberrations involve in particular SA (=spherical aberration), AST (=astigmatism) and PTZ (=image field or Petzval curvature) of low and high orders.

In principle the aberrations which are rather difficult to correct can be subdivided into two categories:

A first category of aberrations which are heavily dependent on the field and weakly dependent on the aperture, includes AST and PTZ of higher order (low-order PTZ is corrected either with mirrors, see FIG. 5, or with negative lens groups, see FIGS. 7 through 9). Aspheric members are suitable for influencing the aberrations of this first category in regions where the height of the principle ray which emanates from the object point at the maximum spacing relative to the optical axis is great, but the height of the edge ray which emanates from the object point on the optical axis is not zero.

A second category of aberrations which are heavily dependent on aperture and weakly dependent on the field includes in particular oblique spherical aberration. Aspheric members are suitable for influencing the aberrations of that second category in regions where the height of the edge ray which emanates from the object point on the optical axis is great but the height of the principal ray which emanates from the object point at maximum spacing relative to the optical axis is not zero.

The above-indicated regions are thus respective zones involving divergent or convergent beams which in the imaging system are arranged at positions of relatively small optically free diameter (that is to say in front or after positions of maximum optical free diameter). By virtue of the fact that, in accordance with the invention, there is provided at least one aspheric lens surface for which the condition $|\sin \sigma / \sin \sigma_o| > 0.4$ is fulfilled, the aspheric member or members in question are specifically inserted in those zones with divergent or convergent beams so that this provides correction of aberrations which is matched targetedly at the factors involved in the symmetrical or quasi-symmetrical systems according to the invention and which is thus particularly effective.

For the imaging scale β' preferably the condition $0.80 \leq \beta' \leq 1.20$, still more preferably β'=1, is fulfilled.

In accordance with a further preferred embodiment the image-side numerical aperture (NA) is greater than 0.30, preferably greater than 0.40 and still more preferably greater than 0.60.

In accordance with a preferred embodiment an intermediate space between the image plane-side last optical element and the image plane and/or an intermediate space between the object plane-side last optical element and the object plane is filled with an immersion medium which has a refractive index of greater than one.

In accordance with a preferred embodiment the imaging system according to the invention is designed for a wavelength of 248 nm, in particular 193 nm, further particularly 157 nm.

Particularly for use for wafer level packaging, the imaging system of the invention, in accordance with a further preferred embodiment, is designed for at least one of the wavelengths 436 nm, 405 nm and 365 nm (g-, h- and i-lines in the spectrum of the mercury vapor lamp).

In accordance with a further aspect the invention concerns a microlithographic projection exposure apparatus, a process for the microlithographic production of microstructured devices, a process for wafer level packaging, a microstructured device, an LCD arrangement and a flat panel display.

Further configurations of the invention are set forth in the description hereinafter and the appendant claims.

The invention is described in greater detail hereinafter by means of embodiments by way of example illustrated in the accompanying drawings.

DETAILED DESCRIPTION OF PREFERRED EMBODIMENTS

Figure 1:
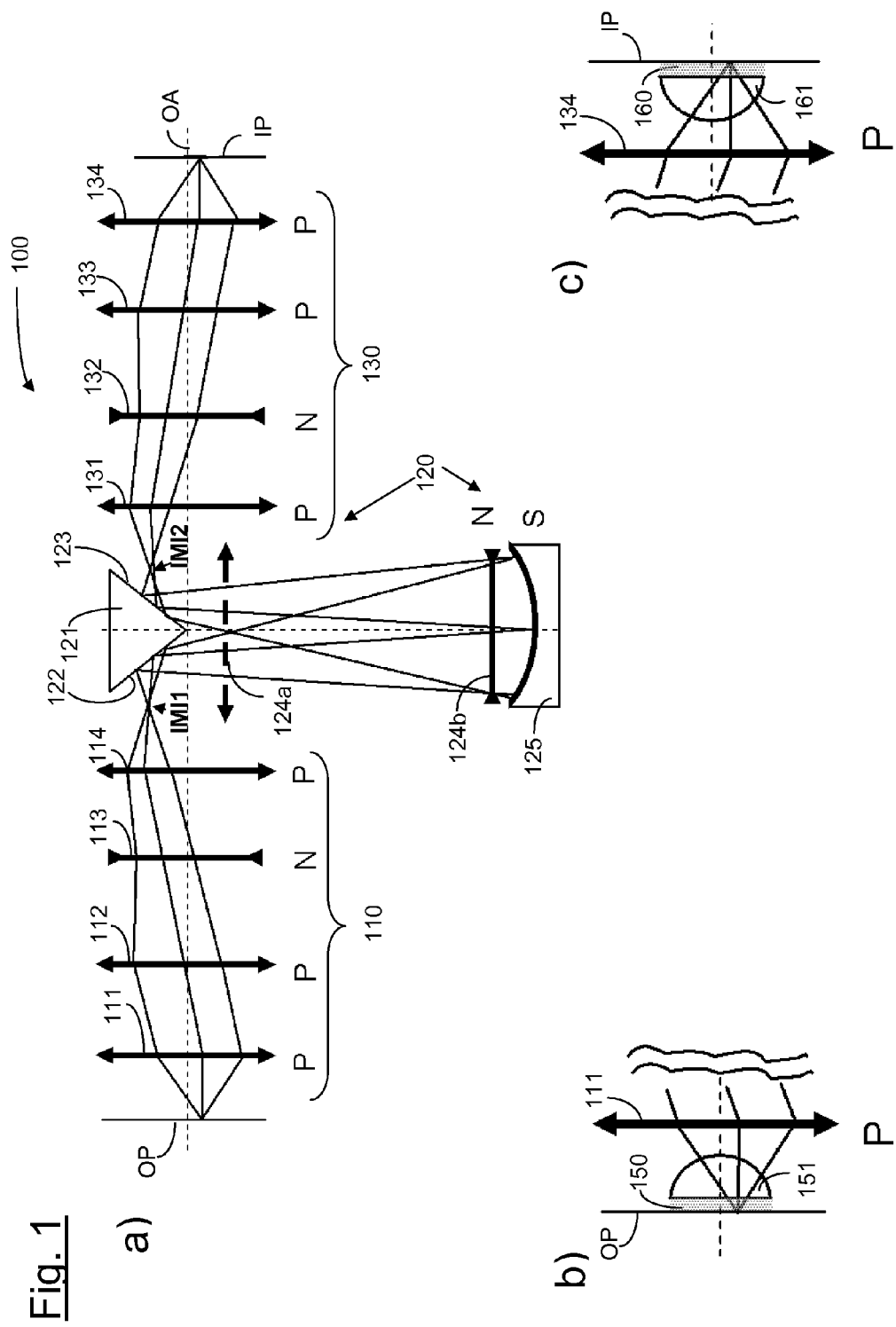
FIG. 1a)-c) show schematic system diagrams to illustrate the structure in principle of an imaging system according to the invention in accordance with a first embodiment of the invention, which is of a catadioptric design, FIGS. 2a)-i) show diagrammatic partial views of different modifications of the structure in principle of FIG. 1, FIG. 3a)-c) show schematic system diagrams to illustrate the structure in principle of an imaging system according to the invention in accordance with a further embodiment of the invention, which is of a catadioptric design, FIG. 4a)-c) show schematic system diagrams to illustrate the structure in principle of an imaging system according to the invention in accordance with a further embodiment of the invention, which is of a catadioptric design.

Referring to FIG. 1 the structure in principle of a catadioptric imaging system 100 in accordance with a first embodiment of the present invention is illustrated therein.

The imaging system 100 has a first optical subsystem 110, a second optical subsystem 120 and a third optical subsystem 130.

In the sense of the present application, the term 'subsystem' always denotes such an arrangement of optical elements, by which a real object is represented in a real image or intermediate image. In other words, each subsystem starting from a given object or intermediate image plane always includes all optical elements to the next real image or intermediate image.

Furthermore, in the sense of the present application, the term 'optical axis' denotes a respective straight line or a succession of straight line portions, which extends through the center points of curvature of the respective optical components.

Furthermore, in the sense of the present application, the term 'imaging scale' of a subsystem denotes the ratio of the magnitude of the image field produced by the subsystem from a given object field relative to the magnitude of the respective object field.

In accordance with the foregoing definitions the optical subsystem 110 includes along the optical axis a first positive lens group 111, a second positive lens group 112, a third negative lens group 113 and a fourth positive lens group 114, downstream of which is produced a first intermediate image IMI1. Arranged in the beam path downstream of the first intermediate image IMI1 is a double folding mirror 121 having two mirror surfaces 122 and 123 disposed at an angle relative to each other, in such a way that incoming light from the lens group 114 is firstly reflected at the mirror surface 122 in the direction of a positive lens group 124a, a negative lens group 124b and a subsequent concave mirror 125. The light reflected at the concave mirror 125, after again passing through the negative lens group 124b and the positive lens group 124a, is reflected at the second mirror surface 1213 of the double folding mirror 121 so that the optical axis OA is as a result folded twice through 90°. The subsystem 120 produces a second intermediate image IM2 and the light emanating therefrom then impinges on the third optical subsystem 130 which comprises a first positive lens group 131, a second negative group 132, a third positive lens group 133 and a fourth positive lens group 134. The second intermediate image IM2 is produced on the image plane 'IP' by the third optical subsystem 130.

The concave mirror 125 of the second optical subsystem, in per se known manner, permits effective compensation of the image field curvature produced by the subsystems 110 and 130, wherein the subsystems 110 and 130 can each in themselves be substantially uncorrected in respect of their Petzval sum so that the imaging system 100 produces an image field which in the ideal case is flat, while being of a relatively simple structure.

As can be seen from the diagrammatic sectional views in FIGS. 1b and 1c, it is possible to provide, in adjoining relationship with the object plane OP and/or the image plane IP, an immersion medium 150 or 160 respectively (for example deionised water) with a refractive index n of greater than one, which is then disposed between the object or image plane respectively and an object plane-side or image plane-side last optical element 151 and 161 respectively.

With respect to an axis of symmetry extending through the double folding mirror 121 the imaging system 100 is of a mirror image-symmetrical structure and in particular also of a doubled telecentric structure (that is to say telecentric at the object side and the image side). The imaging scale $\beta_o$ of the first, object plane-side subsystem 110 (which produces the first intermediate image IMI1 which is enlarged in relation to the object field) corresponds precisely to the inverse of the imaging scale $\beta_i$ of the third, image plane-side subsystem 130 (which produces from the second intermediate image IMI2 an image field which is reduced in size in relation thereto).

The relationship $\beta_o * \beta_i = 1$ therefore applies to the imaging system 100. In addition, as can also be seen from FIG. 1, the imaging scale $\beta_2$ of the second optical subsystem 120 is $\beta_2 = 1$ so that the entire imaging system 100 is implemented with an imaging scale $\beta_o * \beta_2 * \beta_i = 1$, that is to say as a pure 'copy system'.

As a departure from the ideal mirror symmetry shown in FIG. 1, it is also possible in accordance with the invention for the product of the object plane-side imaging scale and the image plane-side imaging scale $\beta_o * \beta_i$ to deviate from the exact value 1 and in particular to lie numerically within the limits $0.75 \leq \beta_o * \beta_i \leq 1.25$, in particular the limits $0.85 \leq \beta_o * \beta_i \leq 1.15$ and further in particular the limits $0.95 \leq \beta_o * \beta_i \leq 1.05$. Those ranges, in accordance with the invention, define an almost symmetrical or 'quasi-symmetrical' structure.

It will be appreciated moreover that the present invention also embraces any splitting of optical elements into a plurality of optical elements, for example, but without limitation, in the form of mutually joined or wrung lens components insofar as the above-indicated relationships are fulfilled for the imaging scales $\beta_o$, $\beta_i$ in question.

Furthermore in accordance with the invention any modification of the structure in principle shown in FIG. 1 is embraced, in which possibly further optical subsystems are arranged between the object plane-side subsystem 110 and the image plane-side subsystem 130, which respectively produce further intermediate images IMI3, IMI4, . . . .

The invention is also not restricted to the symmetrical position of the intermediate images IMI1 and IMI2, which is shown in FIG. 1. Rather the invention also embraces in particular any modification of the structure in principle shown in FIG. 1, in which the intermediate images IMI1 and IMI2 are not symmetrical with respect to the double folding mirror 121. Such alternative configurations are shown in FIGS. 2a)-2i) by way of example but without limitation.

In this respect FIG. 2a corresponds to the structure already shown in FIG. 1. It is to be noted that for example upon the production of the first intermediate image IMI1 in the light path only after reflection at the first mirror surface 122 (as can be seen from FIGS. 2b, 2c, 2e, 2f, 2h and 2i), the first mirror surface 122 by definition (see the foregoing definition) is still to be associated with the first optical subsystem 110 so that in this case the first optical subsystem 110 is catadioptric (and not purely refractive as shown in FIG. 1). In addition (as can be seen from FIGS. 2c, 2f and 2i), upon the production of the first intermediate image IMI1 in the light path only after passing through the positive lens group 124*a*, by way of example the positive lens group 124*a* can also still be associated with the first optical subsystem 100.

It is apparent to the man skilled in the art that a variation in the catadioptric structure shown in FIG. 1, in the context of the present invention, is possible in the above-indicated manners and many other ways.

Figure 3:
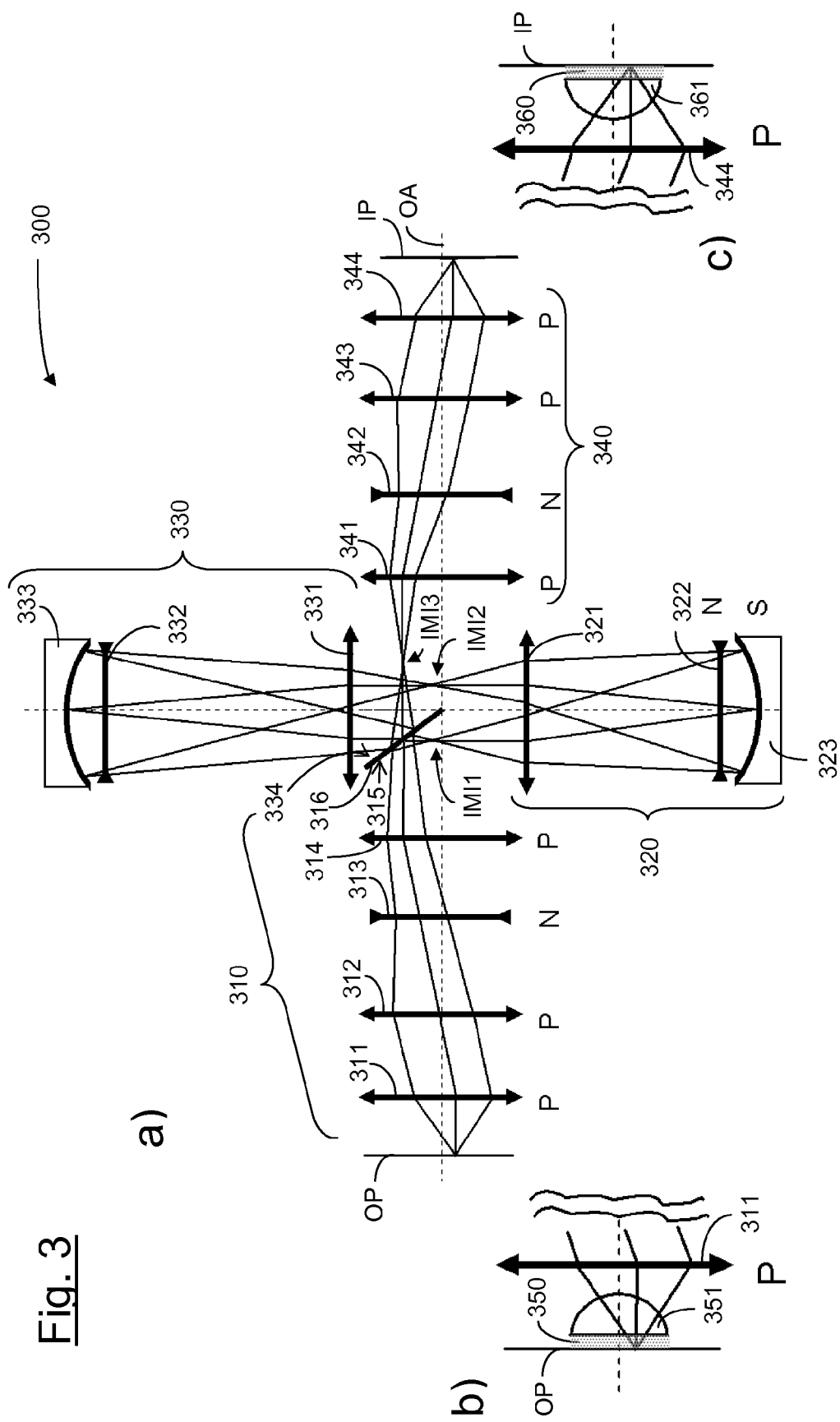

A further possible structure as a matter of principle of an imaging system according to the present invention is shown in FIG. 3. The imaging system 300 has a first optical subsystem 310, a second optical subsystem 320, a third optical subsystem 330 and a fourth optical subsystem 340, wherein a total of three intermediate images IMI1-IMI3 are produced between the subsystems 310-340.

More precisely the first optical subsystem 310, along the optical axis, includes a first positive lens group 311, a second positive lens group 312, a third negative lens group 313 and a fourth positive lens group 314, as well as a first reflecting surface 315 of a plane mirror 316 which is reflecting at both sides and behind which a first intermediate image IMI1 is produced. The first intermediate image IMI1 is imaged on to a second intermediate image IMI2 by the second optical subsystem 320 which includes a first positive lens group 321, a second negative lens group 322 and a concave mirror 323. The second intermediate image IMI2 is imaged on to a third intermediate image IMI3 by the third optical subsystem 330 which includes a first positive lens group 331, a second negative lens group 332, a concave mirror 333 and a second reflecting surface 334 of the plane mirror 316 which is reflecting at both sides. The third intermediate image IMI3 is imaged on to the image plane 'IP' by the fourth optical subsystem 340 which comprises a first positive lens group 341, a second negative lens group 342, a third positive lens group 343 and a fourth positive lens group 344.

Similarly to the embodiment shown in FIG. 1, as can be seen from the diagrammatic sectional views in FIGS. 3*b* and 3*c*, it is possible to provide in adjoining relationship with the object plane OP and/or the image plane IP an immersion medium 350 or 360 respectively with a refractive index n of greater than one (for example deionised water), which is then between the object plane and the image plane respectively and an object plane-side and an image plane-side last optical element 351 and 361 respectively.

Figure 2:
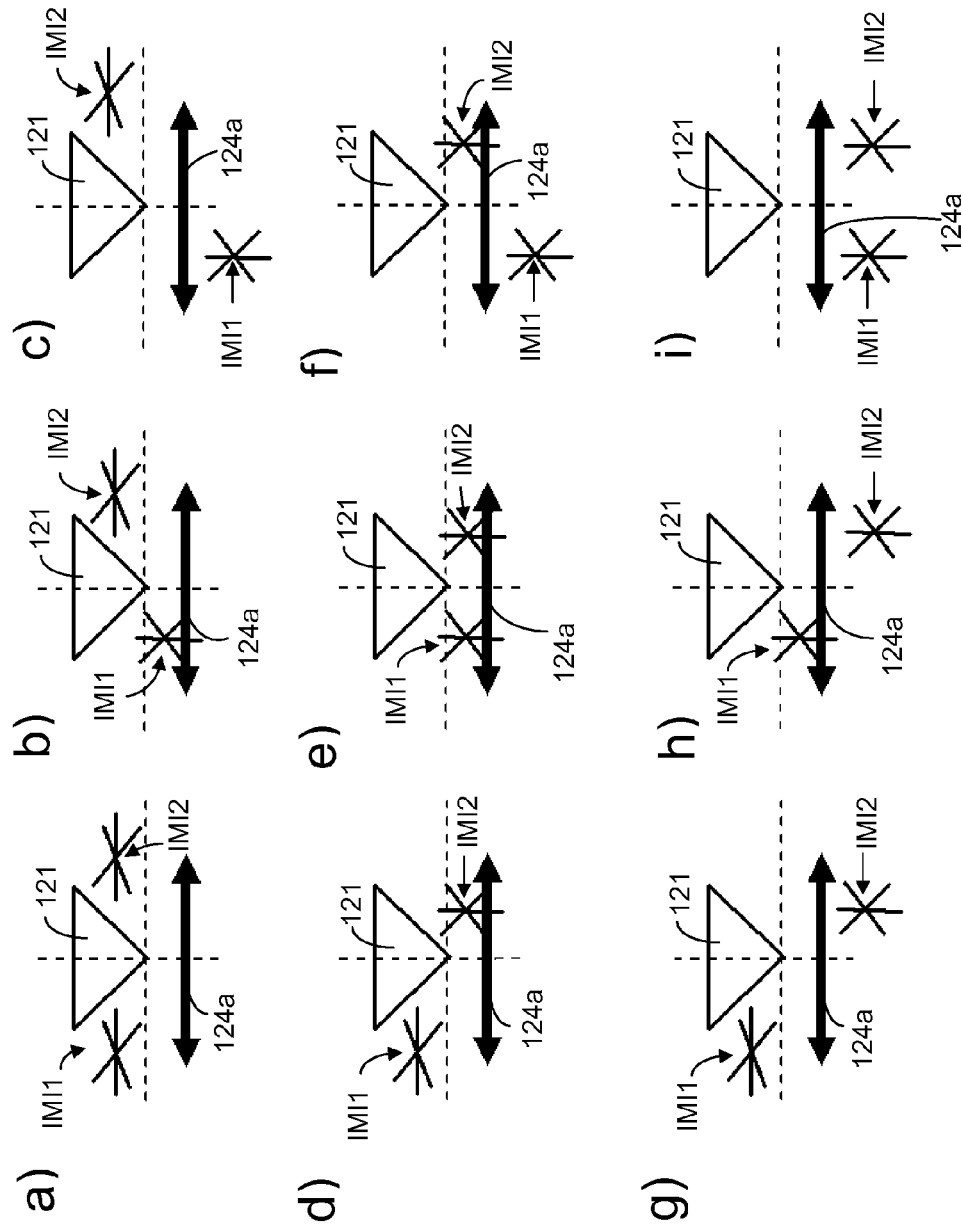

It will be appreciated that, similarly to FIG. 2, the invention also embraces modifications in which the respective intermediate images are at alternative positions so that depending on the respective relative position in relation to the intermediate image, by definition, individual optical components or groups can also be associated with another optical subsystem, wherein in turn the categorisation of the respective subsystem as catadioptric, catoptric or dioptric (that is to say purely refractive) can be modified.

In the imaging system 300 the imaging scale $\beta_o$ of the first, object plane-side subsystem 310 (which produces the image of the object field in the first intermediate image IMI1) precisely corresponds to the inverse of the imaging scale $\beta_i$ of the fourth, image plane-side subsystem 340 which produces the image field from the third intermediate image IMI3. Therefore once again the relationship $\beta_o*\beta_i=1$ applies.

The imaging system 300 is also in particular doubled telecentric (that is to say at the object side and the image side).

Similarly to FIG. 1, in respect of the principle shown in FIG. 3 such 'quasi-symmetrical' modifications are also to be deemed to be embraced by the present invention, in which the product $\beta_o*\beta_i$ deviates from the exact value 1 and in particular occurs in numerical terms within the limits $0.75 \leq \beta_o*\beta_i \leq 1.25$, in particular the limits $0.85 \leq \beta_o*\beta_i \leq 1.15$ and further in particular the limits $0.95 \leq \beta_o*\beta_i \leq 1.05$.

The concave mirror 323 of the second optical subsystem 320 and the concave mirror 333 of the third optical subsystem 330 in turn in per se known manner permit effective compensation for the image field curvature produced by the subsystems 310 and 340 (each substantially uncorrected in itself) so that the imaging system 300 produces an image field which in the ideal case is flat, while being of a relatively simple structure.

A further structure which is possible in principle of an imaging system according to the present invention is shown in FIG. 4. The imaging system 400 has a first optical subsystem 410, a second optical subsystem 420 and a third optical subsystem 430 so that two intermediate images IMI1 and IMI2 are produced between the subsystems 410-430.

More precisely the first optical subsystem 410, along the optical axis, comprises a first positive lens group 411, a second positive lens group 412, a third negative lens group 413 and a fourth positive lens group 414, behind which a first intermediate image IMI1 is produced. The first intermediate image IMI1 is imaged on to a second intermediate image IMI2 by the second optical subsystem 420 which comprises a first concave mirror 421 and a second concave mirror 422 (which in the region of the optical axis as shown in FIG. 4 are alternatively cut off or interrupted or apertured). The second intermediate image IMI2 is imaged on to the image plane 'IP' by the third optical subsystem 430 which comprises a first positive lens group 431, a second negative lens group 432, a third positive lens group 433 and a fourth positive lens group 434.

In the imaging system 400 the imaging scale $\beta_o$ of the first, object plane-side subsystem 410 (which produces the image of the object field in the first intermediate image IMI 1) corresponds precisely to the inverse of the imaging scale $\beta_i$ of the third, image plane-side subsystem 430 which produces the image field from the second intermediate image IMI2. Accordingly the relationship $\beta_o*\beta_i=1$ again applies. The imaging system 400 is also in particular doubled telecentric (that is to say at the object side and the image side).

Similarly to FIGS. 1 and 3, in respect of the principle shown in FIG. 4 such 'quasi-symmetrical' modifications are also to be deemed to be embraced by the present invention, in which the product $\beta_o*\beta_i$ deviates from the exact value 1 and in particular occurs in numerical terms within the limits $0.75 \leq \beta_o*\beta_i \leq 1.25$, in particular the limits $0.85 \leq \beta_o*\beta_i \leq 1.15$ and further in particular the limits $0.95 \leq \beta_o*\beta_i \leq 1.05$.

Furthermore the concave mirrors 421 and 422 of the second optical subsystem 420 once again (in per se known manner) permit effective compensation of the image field curvature so that the imaging system 400 produces an image field which is flat in the ideal case, while being of a relatively simple structure.

Similarly to the embodiments shown in FIG. 1 and FIG. 3, as can be seen from the diagrammatic sectional views in FIGS. 4b and 4c it is possible to provide in adjoining relationship with the object plane OP and/or the image plane IP an immersion medium 450 and 460 respectively with a refractive index n of greater than 1 (for example deionised water), which is then between the object plane and the image plane respectively and an object plane-side and image plane-side last optical element 451 and 461 respectively.

Figure 5:
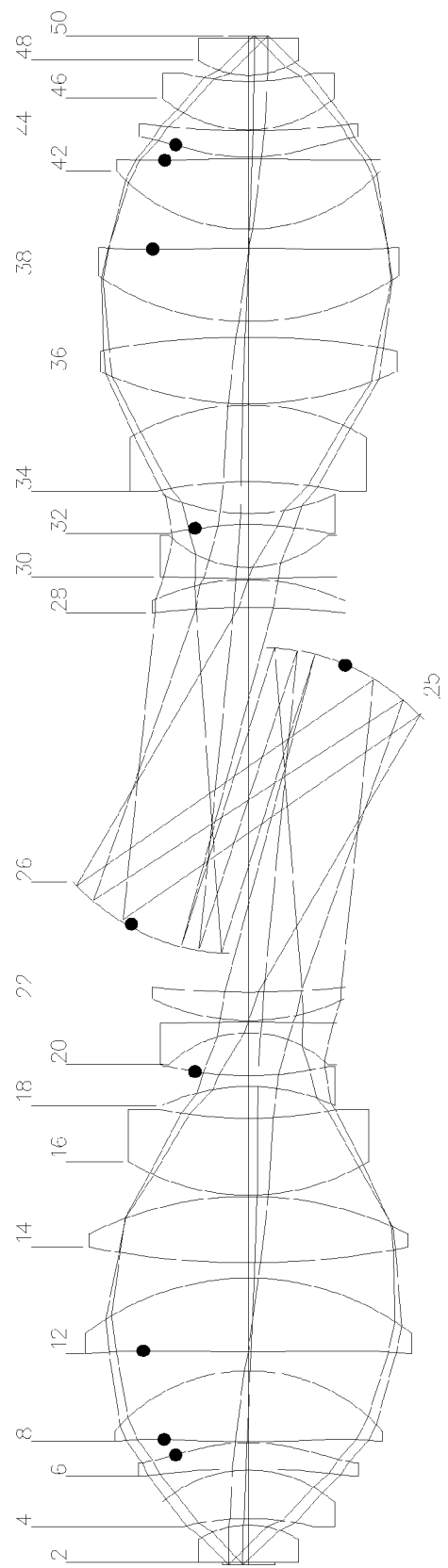
FIG. 5 shows a meridional overall section through a complete catadioptric projection objective in accordance with an actual embodiment of the invention.

FIG. 5 shows a meridional overall section through a complete catadioptric projection objective 500 in accordance with a further embodiment of the invention.

The design data of the projection objective 500 are set out in Table 1: radii and thicknesses are specified in millimeters. The figures above the projection objective 500 refer to selected surfaces of optical elements. The surfaces which are identified by dots and which are specified in Table 2a are aspherically curved, the curvature of those surfaces being given by the following aspheric formula:

$$P(h) = \frac{(1/r) \cdot h^2}{1 + \sqrt{1-(1+K)(1/r)^2 h^2}} + C_1 h^4 + C_2 h^6 + \ldots$$

In that formula P denotes the camber height of the surface in question in parallel relationship with the optical axis, h denotes the radial spacing from the optical axis, r denotes the radius of curvature of the surface in question, K denotes the conical constant and C1, C2, . . . denote the aspheric constants set out in Table 2a.

The projection objective 500 is designed for a wavelength of about 193 nm and deionised water as the immersion liquid. The imaging scale of the projection objective 500 is β=1.00 and the numerical aperture NA=1.1, with an outside field diameter of 33 mm and an inside field diameter of 9.32 mm, which allows a rectangular field of 26*5.5 mm². The wave front error is approximately 0.009*λ, with respect to the wave front RMS value averaged over the image field.

Figure 10:
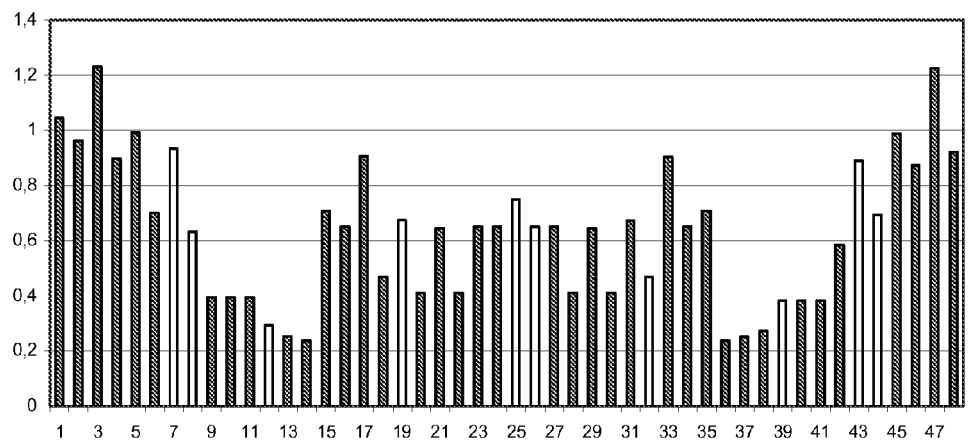

Table 2b sets out in relation to each surface the values $\sin(\sigma_o)$, $\sigma_{max}$, $\sin(\sigma_{max})$ and $\sin(\sigma_{max})/\sin(\sigma_o)$, wherein $\sigma_{max}$ gives the maximum angle of inclination of the rays which issue from the lens surface in question to the next lens surface, and wherein $\sigma_o$ gives the angle of inclination of that edge ray which issues from the object point on the optical axis, relative to the optical axis. FIG. 10 shows a diagram in which, for each surface number (plotted on the horizontal axis), the associated value for $\sin(\sigma_{max})/\sin(\sigma_o)$ is represented by the bar height. Accordingly the condition |sin σ/sin $\sigma_o$|>0.4 is satisfied for the aspheric surfaces '7', '8', '19', '25', '26', '32', '43' and '44'.

Figure 6:
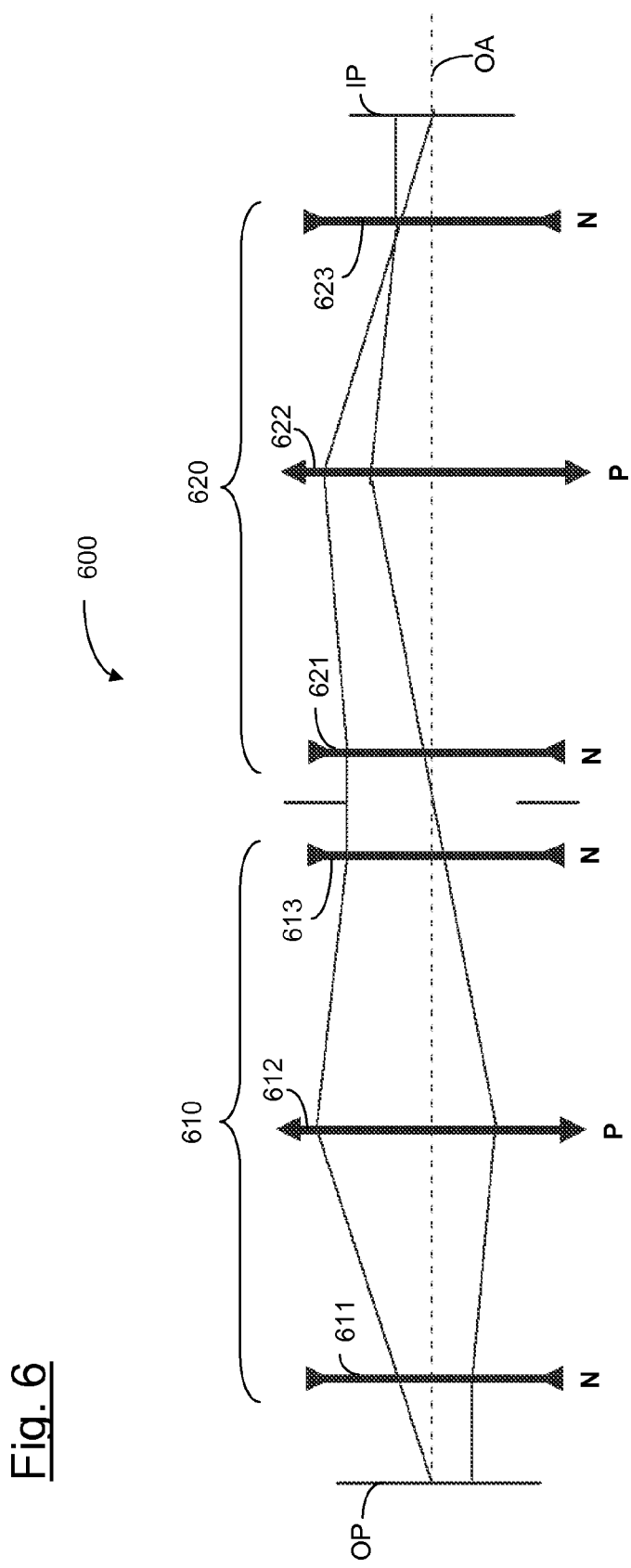
FIG. 6 shows a schematic system diagram to illustrate the structure in principle of an imaging system according to the invention in accordance with a further embodiment of the invention, which is of a purely refractive design, FIGS. 7-9 each show a meridional overall section through a complete projection objective of a purely refractive design in accordance with further actual embodiments of the invention, FIGS. 10-13 each show a respective diagram in which, for each of the optical surfaces of the projection objectives of FIG. 5 and FIGS. 7-9 respectively (in accordance with the surface number plotted on the horizontal axis), the associated value for $\sin(\sigma_{max})/\sin(\sigma_o)$ is represented by the bar height in the diagram.

A further structure which is possible in principle of an imaging system in accordance with the present invention is shown in FIG. 6. The imaging system 600 has a first dioptric group of overall positive refractive power 610 (hereinafter referred to as the positive lens group 610) and a second dioptric group of overall positive refractive power 620 (hereinafter referred to as the positive lens group 620). The first positive lens group 610 in turn comprises in succession a negative lens group 611, a positive lens group 612 and a negative lens group 613. The second positive lens group 620 in turn comprises in succession a negative lens group 621, a positive lens group 622 and a negative lens group 623.

Specific designs are now set out hereinafter, which are each constructed in accordance with the general design principle of FIG. 6, wherein the design is so selected in each case as to implement a structure which is at least substantially mirror image-symmetrical in relation to the pupil plane, with an imaging scale β, for which the condition 0.50≦β≦1.50 is fulfilled, which at the same time is doubled telecentric (that is to say telecentric at the object plane side and the image plane side) and in which image-side numerical apertures of at least NA=0.3 are embodied. In these embodiments 'copy systems' are respectively implemented with an imaging scale β close to 1, which are accordingly distinguished in that, with a symmetrical or at least quasi-symmetrical structure (and the advantages resulting therefrom, in particular in terms of production and internal error correction), they have a comparatively high resolution capability.

Figure 7:
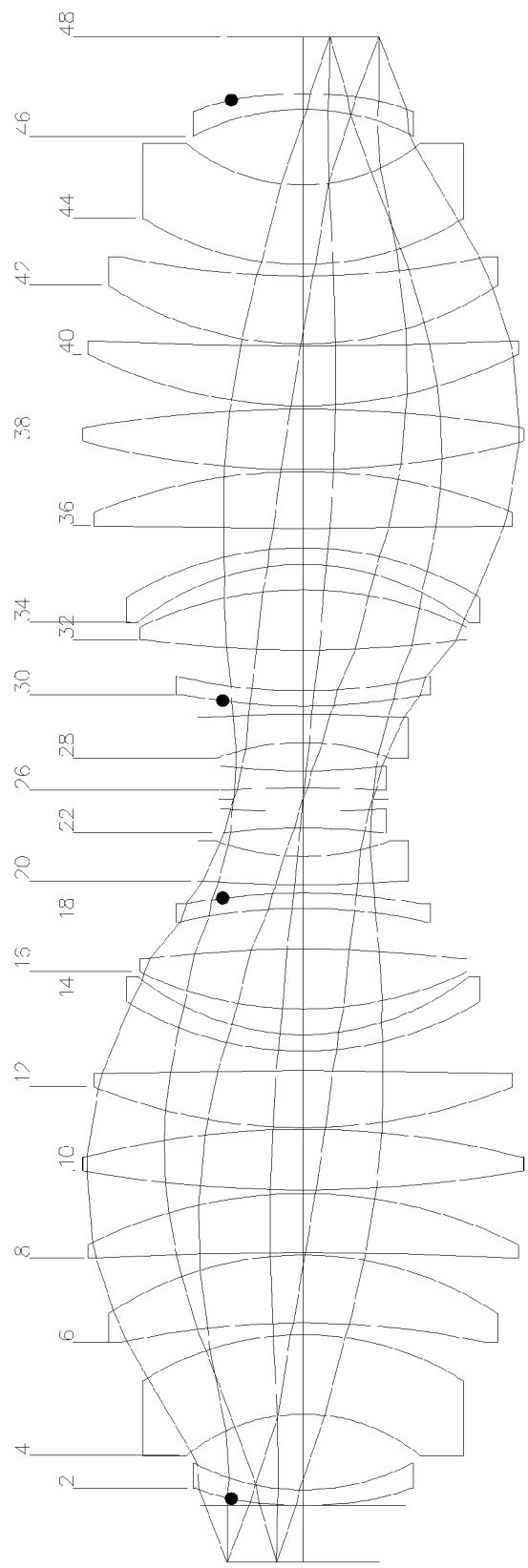

FIG. 7 shows a meridional overall section through a complete purely refractive (dioptric) projection projective 700 which is constructed in accordance with the design principle of FIG. 6. The design data of the projection objective 700 are set out in Table 3, while the surfaces specified in Table 4a are aspherically curved. The imaging scale of the projection objective 700 is β=1.00, the numerical aperture NA=0.3 and the field diameter is 100 mm. The wave front error is about 0.003*λ (with respect to the wave front RMS value averaged over the image field).

Figure 11:
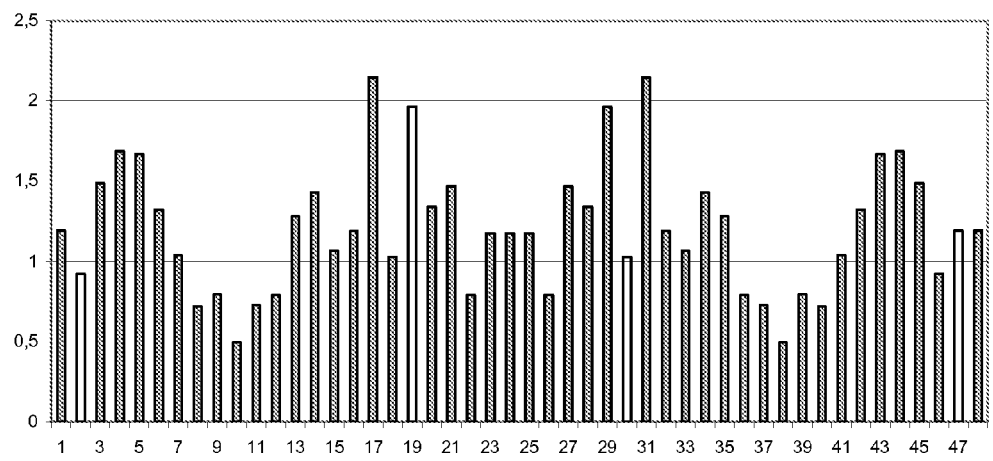

As can be seen from FIG. 7 and Table 4a the surfaces 2, 19, 30 and 47 are aspherically curved. Table 4b again specifies the values $\sin(\sigma_o)$, $\sigma_{max}$, $\sin(\sigma_{max})$ and $\sin(\sigma_{max})/\sin(\sigma_o)$ for each surface. FIG. 11 shows a diagram in which, for each surface number (plotted on the horizontal axis) the associated value for $\sin(\sigma_{max})/\sin \sigma_o$ is represented by the bar height.

The aspherically curved surfaces in each case involve lens surfaces in zones with divergent beams (surfaces 2, 30) or convergent beams (surfaces 19, 47) which in the imaging system are arranged at positions of relatively small optically free diameter (that is to say before or after positions with a maximum optically free diameter), and in respect of which, as shown in Table 4b and FIG. 11, the condition |sin σ/sin $\sigma_o$|>0.4 is fulfilled, thereby achieving correction of aberrations which is matched targetedly to the factors in the symmetrical system and thus particularly effective.

Figure 8:
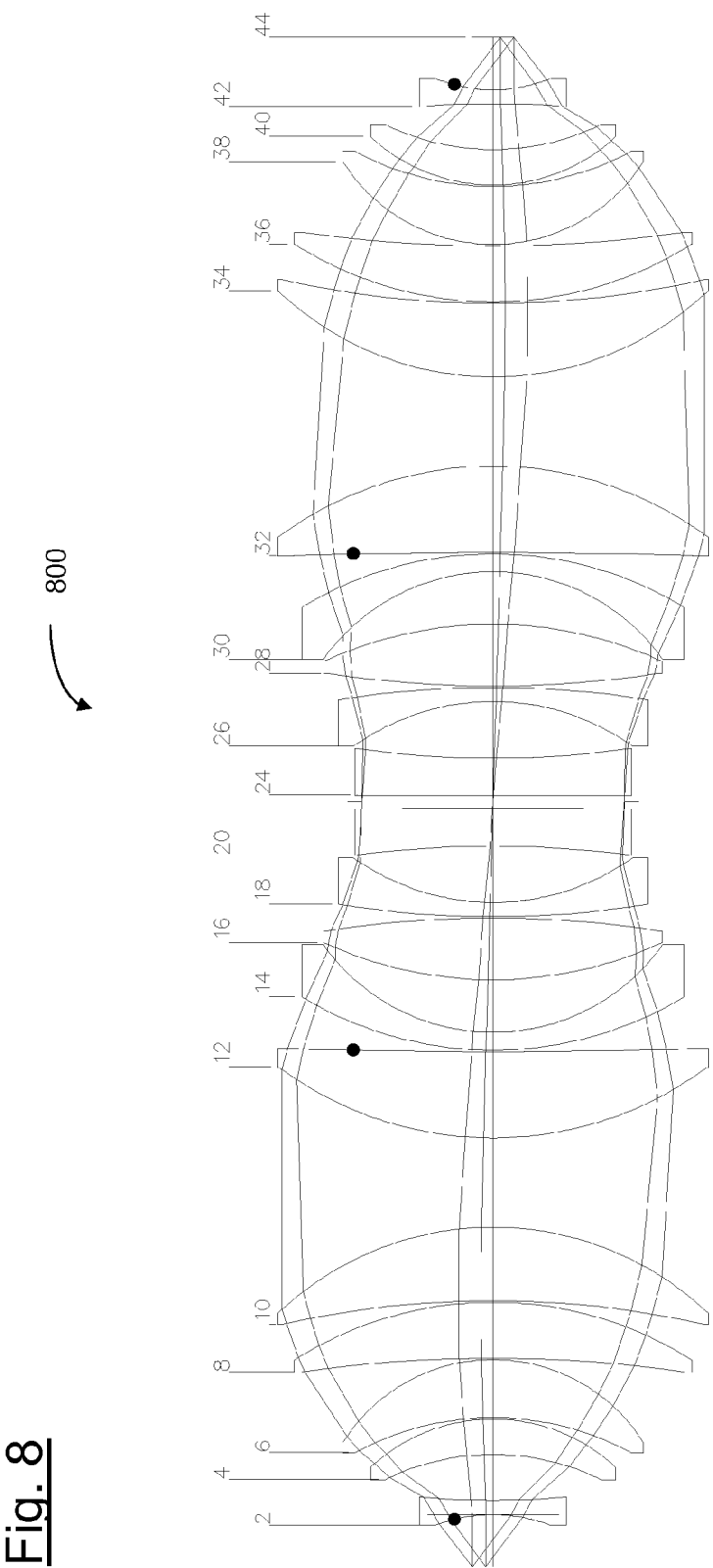

FIG. 8 shows a meridional overall section through a further complete, purely refractive projection objective 800 which is constructed in accordance with the design principle of FIG. 6. The design data of the projection objective 800 are set out in Table 5, wherein the surfaces identified by dots and specified in Table 6a are aspherically curved.

The imaging scale of the projection objection 800 is β=1.00, the numerical aperture NA=0.6 and the field diameter is 30 mm. The wave front error is about 0.015*λ (with respect to the wave front RMS value averaged over the image field).

As can be seen from FIG. 8 and Table 6a the surfaces 2, 13, 32 and 43 are aspherically curved. Table 6b gives the values $\sin(\sigma_o)$, $\sigma_{max}$, $\sin(\sigma_{max})$ and $\sin(\sigma_{max})/\sin(\sigma_o)$ for each surface. FIG. 12 again shows a diagram in which, for each surface number (plotted on the horizontal axis), the associated value for $\sin(\sigma_{max})/\sin(\sigma_o)$ is represented by the bar height. Accordingly the condition $|\sin \sigma/\sin \sigma_o|>0.4$ is fulfilled for the surfaces '2', '13' and '43'.

Figure 9:
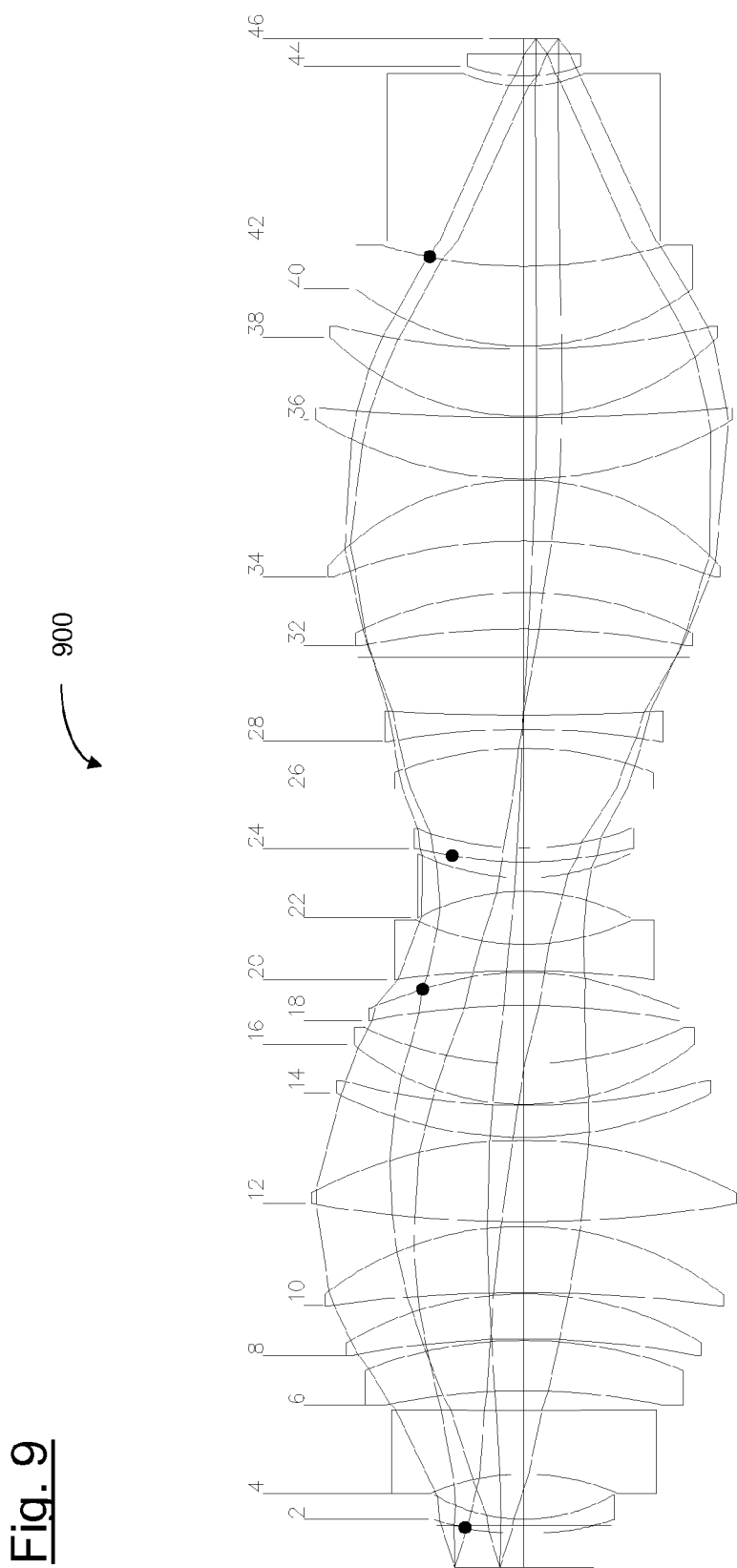

FIG. 9 shows a meridional overall section through a further complete, purely refractive projection objective which is constructed in accordance with the design principle of FIG. 6 and which is of a not completely symmetrical structure. The design data of the projection objection 800 are set out in Table 7, wherein the surfaces characterised by dots and specified in Table 8a are aspherically curved. The imaging scale of the projection objective 800 is $\beta=0.50$, the numerical aperture NA=0.6 and the field diameter is 50 mm. The wave front error is about $0.004*\lambda$ (with respect to the wave front RMS value averaged over the image field).

As can be seen from FIG. 9 and Table 8a, the surfaces 2, 19, 24 and 41 are aspherically curved. Table 8b specifies for each surface the values $\sin(\sigma_o)$, $\sigma_{max}$, $\sin(\sigma_{max})$ and $\sin(\sigma_{max})/\sin(\sigma_o)$. FIG. 13 again shows a diagram in which, for each surface number (plotted on the horizontal axis), the associated value for $\sin(\sigma_{max})/\sin(\sigma_o)$ is represented by the bar height. Accordingly the condition $|\sin \sigma/\sin \sigma_o|>0.4$ is fulfilled for all aspherical surfaces. In this case also a particularly effective correction of aberrations is achieved.

Figure 14:
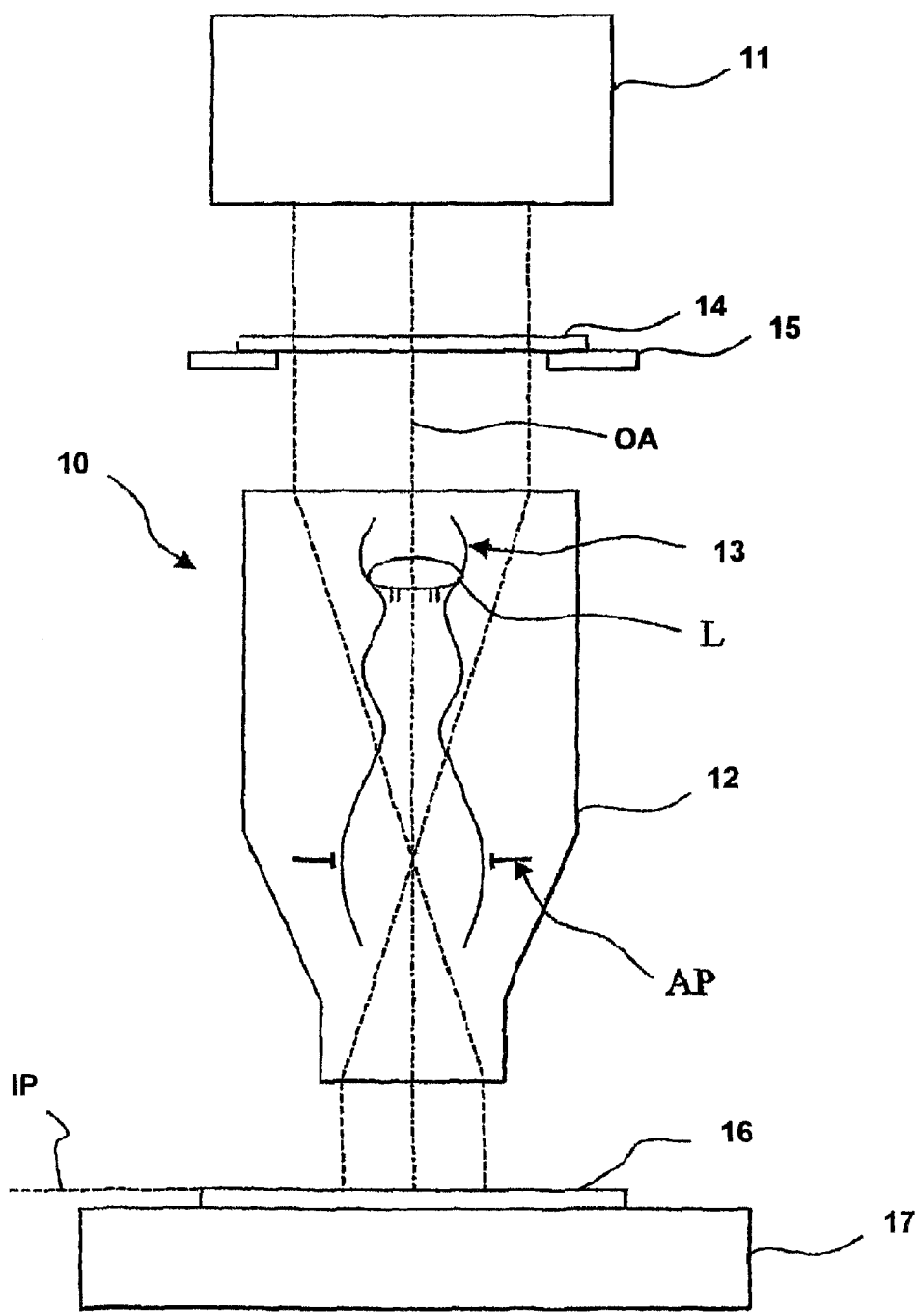
FIG. 14 shows the diagrammatic structure of a microlithography projection exposure apparatus.

FIG. 14 shows the structure in principle of a projection exposure apparatus. As shown in FIG. 14 a projection exposure apparatus 10 has an illumination device 11 and a projection objective 12. The projection objective 12 comprises a lens arrangement 13 with an aperture plate AP, wherein an optical axis OA is defined by the lens arrangement 13 which is only diagrammatically indicated. Arranged between the illumination device 11 and the projection objective 12 is a mask 14 which has a structure in the micrometer to nanometer range and which is held in the beam path by means of a mask holder. The image of the structure is produced by means of the projection objective 12 on the image plane IP in which a photosensitive substrate 16 positioned by a substrate holder 17, or a wafer, is held.

An imaging system according to the invention, for example in accordance with one of the above-described embodiments, is used as the projection objective 12. The apparatus can also advantageously be used for wafer level packaging, in which comparatively large areas (for example between two and four chips of a size 26 mm*33 mm) are exposed in a step ('step-and-repeat' mode) in order in particular to produce a plurality of semiconductor chips produced on a wafer with electrical contacts in a lithography process.

To sum up the present application presents imaging systems having an imaging scale of close to 1 ('copy systems'), in particular for microlithography, which on the one hand are of a comparatively simple structure which is advantageous from the point of view of production engineering and which on the other hand make it possible to achieve relatively high levels of resolution.

If the invention has also been described by reference to specific embodiments, numerous variations and alternative embodiments will present themselves to the man skilled in the art. Accordingly it will be appreciated by the man skilled in the art that such variations and alternative embodiments are also embraced by the present invention and the scope of the invention is limited only in the sense of the accompanying claims and equivalents thereof.

TABLE 1

(DESIGN DATA for FIG. 5)

| SURFACE | RADII | THICKNESSES | GLASSES | DIAMETER |
|---|---|---|---|---|
| 1 | 0.000000 | 0.000000 | H2OV | 18.832 |
| 2 | 0.000000 | 31.351111 | SIO2V | 18.832 |
| 3 | −76.827122 | 5.490428 | AIR | 39.038 |
| 4 | −220.265044 | 41.109617 | SIO2V | 51.925 |
| 5 | −109.799301 | 0.991614 | AIR | 69.228 |
| 6 | −621.687484 | 22.403985 | SIO2V | 83.807 |
| 7 | −160.262417 | 0.981642 | AIR | 89.064 |
| 8 | 861.455748 | 60.227866 | SIO2V | 103.424 |
| 9 | −148.068950 | 10.117252 | AIR | 109.392 |
| 10 | 0.000000 | 0.000000 | AIR | 127.886 |
| 11 | 0.000000 | 5.805341 | AIR | 127.886 |
| 12 | 1467.209534 | 62.725007 | SIO2V | 129.476 |
| 13 | −222.943738 | 13.160623 | AIR | 133.829 |
| 14 | 672.972896 | 56.541030 | SIO2V | 130.895 |
| 15 | −294.887142 | 1.000740 | AIR | 129.559 |
| 16 | 191.084097 | 65.379964 | SIO2V | 97.669 |
| 17 | 375.563222 | 26.988297 | AIR | 72.978 |
| 18 | −169.889516 | 9.494007 | SIO2V | 69.431 |
| 19 | 330.690785 | 36.198473 | AIR | 64.258 |
| 20 | −95.586010 | 9.495976 | SIO2V | 63.619 |
| 21 | −2451.271499 | 1.013402 | AIR | 71.048 |
| 22 | 186.204930 | 24.070106 | SIO2V | 77.673 |
| 23 | 781.623758 | 32.415180 | AIR | 77.999 |
| 24 | 0.000000 | 262.078507 | AIR | 80.953 |
| 25 | −199.787792 | −262.078507 | REFL | 144.265 |
| 26 | 199.787792 | 262.078507 | REFL | 144.261 |
| 27 | 0.000000 | 32.415180 | AIR | 80.970 |
| 28 | −781.623758 | 24.070106 | SIO2V | 78.021 |
| 29 | −186.204930 | 1.013402 | AIR | 77.696 |
| 30 | 2451.271499 | 9.495976 | SIO2V | 71.070 |
| 31 | 95.586010 | 36.198473 | AIR | 63.639 |
| 32 | −330.690785 | 9.494007 | SIO2V | 64.277 |
| 33 | 169.889516 | 26.988297 | AIR | 69.463 |
| 34 | −375.563222 | 65.379964 | SIO2V | 73.005 |
| 35 | −191.084097 | 1.000740 | AIR | 96.183 |
| 36 | 294.887142 | 56.541030 | SIO2V | 119.915 |
| 37 | −672.972896 | 13.160623 | AIR | 121.525 |
| 38 | 222.943738 | 62.725007 | SIO2V | 122.942 |
| 39 | −1467.209534 | 5.805341 | AIR | 117.459 |
| 40 | 0.000000 | 0.000000 | AIR | 115.680 |
| 41 | 0.000000 | 10.117252 | AIR | 115.680 |
| 42 | 148.068950 | 60.227866 | SIO2V | 107.756 |
| 43 | −861.455748 | 0.981642 | AIR | 102.343 |
| 44 | 160.262417 | 22.403985 | SIO2V | 88.976 |
| 45 | 621.687484 | 0.991614 | AIR | 83.723 |
| 46 | 109.799301 | 41.109617 | SIO2V | 69.182 |
| 47 | 220.265044 | 5.490428 | AIR | 51.880 |
| 48 | 76.827122 | 31.351111 | SIO2V | 39.018 |
| 49 | 0.000000 | 2.000000 | H2OV | 18.828 |
| 50 | 0.000000 | 0.000000 | AIR | 16.500 |

TABLE 2a (ASPHERIC CONSTANTS for FIG. 5)

| Sur | 7 | 8 | 12 | 19 | 25 |
|---|---|---|---|---|---|
| K | 0 | 0 | 0 | 0 | −0.474354 |
| C1 | 1.016586e−07 | −5.783301e−08 | −3.233669e−08 | 4.982706e−08 | −3.050790e−09 |
| C2 | 6.908432e−12 | 1.173196e−12 | 5.015975e−13 | −2.918139e−12 | −4.716896e−14 |
| C3 | 2.545336e−16 | −3.123441e−18 | 1.496010e−17 | 1.879762e−16 | −6.952851e−19 |
| C4 | −1.097430e−20 | −3.354956e−22 | −1.011225e−21 | −1.075777e−19 | −1.865614e−23 |
| C5 | −3.517586e−24 | 8.966032e−27 | 1.595586e−26 | 3.174059e−23 | 2.297720e−29 |
| C6 | 1.602876e−28 | −2.609994e−30 | −3.904964e−32 | −3.392173e−27 | −4.041193e−33 |

| SRF | 26 | 32 | 39 | 43 | 44 |
|---|---|---|---|---|---|
| K | −0.474354 | 0 | 0 | 0 | 0 |
| C1 | 3.050790e−09 | −4.982706e−08 | 3.233669e−08 | 5.783301e−08 | −1.016586e−07 |
| C2 | 4.716896e−14 | 2.918139e−12 | −5.015975e−13 | −1.173196e−12 | −6.908432e−12 |
| C3 | 6.952851e−19 | −1.879762e−16 | −1.496010e−17 | 3.123441e−18 | −2.545336e−16 |
| C4 | 1.865614e−23 | 1.075777e−19 | 1.011225e−21 | 3.354956e−22 | 1.097430e−20 |
| C5 | −2.297720e−29 | −3.174059e−23 | −1.595586e−26 | −8.966032e−27 | 3.517586e−24 |
| C6 | 4.041193e−33 | 3.392173e−27 | 3.904964e−32 | 2.609994e−30 | −1.602876e−28 |

TABLE 2b (Values $\sin(\sigma_0)$, $\sigma_{max}$, $\sin(\sigma_{max})$ and $\sin(\sigma_{max})/\sin(\sigma_0)$ for FIG. 5)
$\sin(\sigma_0) = 0.76$

| SURFACE | $\sigma_{max}$ | $\sin(\sigma_{max})$ | $\sin(\sigma_{max})/\sin(\sigma_0)$ |
|---|---|---|---|
| 1 | 53.019027 | 0.798819 | 1.043089 |
| 2 | 47.320398 | 0.735139 | 0.959937 |
| 3 | 70.368891 | 0.941863 | 1.229874 |
| 4 | 43.358362 | 0.686543 | 0.89648 |
| 5 | 49.304534 | 0.758169 | 0.990009 |
| 6 | 32.464766 | 0.536767 | 0.700904 |
| 7 | 45.552832 | 0.71388 | 0.932176 |
| 8 | 28.953332 | 0.484084 | 0.632111 |
| 9 | 17.679933 | 0.303691 | 0.396556 |
| 10 | 17.679933 | 0.303691 | 0.396556 |
| 11 | 17.679933 | 0.303691 | 0.396556 |
| 12 | 12.965369 | 0.224356 | 0.292961 |
| 13 | 11.112407 | 0.192729 | 0.251663 |
| 14 | 10.437841 | 0.181163 | 0.236561 |
| 15 | 32.848716 | 0.542408 | 0.708271 |
| 16 | 29.854681 | 0.497789 | 0.650007 |
| 17 | 43.81267 | 0.692286 | 0.90398 |
| 18 | 21.108003 | 0.360117 | 0.470237 |
| 19 | 31.040202 | 0.515626 | 0.673298 |
| 20 | 18.419158 | 0.315957 | 0.412573 |
| 21 | 29.552453 | 0.493207 | 0.644024 |
| 22 | 18.381517 | 0.315334 | 0.411759 |
| 23 | 29.916025 | 0.498717 | 0.651219 |
| 24 | 29.916025 | 0.498717 | 0.651219 |
| 25 | 35.01861 | 0.573828 | 0.749298 |
| 26 | 29.910029 | 0.498626 | 0.6511 |
| 27 | 29.910029 | 0.498626 | 0.6511 |
| 28 | 18.37719 | 0.315262 | 0.411666 |
| 29 | 29.551369 | 0.49319 | 0.644002 |
| 30 | 18.418801 | 0.315951 | 0.412566 |
| 31 | 31.026412 | 0.515419 | 0.673029 |
| 32 | 21.096771 | 0.359934 | 0.469998 |
| 33 | 43.76743 | 0.691717 | 0.903235 |
| 34 | 29.825194 | 0.497342 | 0.649424 |
| 35 | 32.817596 | 0.541952 | 0.707675 |
| 36 | 10.444065 | 0.18127 | 0.236701 |
| 37 | 11.101869 | 0.192548 | 0.251427 |
| 38 | 12.021847 | 0.208279 | 0.271968 |
| 39 | 17.001443 | 0.292387 | 0.381796 |
| 40 | 17.001443 | 0.292387 | 0.381796 |
| 41 | 17.001443 | 0.292387 | 0.381796 |
| 42 | 26.597123 | 0.447702 | 0.584604 |
| 43 | 42.901226 | 0.68072 | 0.888877 |
| 44 | 32.087267 | 0.531196 | 0.69363 |
| 45 | 49.092717 | 0.755754 | 0.986854 |

TABLE 2b-continued (Values $\sin(\sigma_0)$, $\sigma_{max}$, $\sin(\sigma_{max})$ and $\sin(\sigma_{max})/\sin(\sigma_0)$ for FIG. 5)
$\sin(\sigma_0) = 0.76$

| SURFACE | $\sigma_{max}$ | $\sin(\sigma_{max})$ | $\sin(\sigma_{max})/\sin(\sigma_0)$ |
|---|---|---|---|
| 46 | 41.981503 | 0.668875 | 0.873409 |
| 47 | 69.609962 | 0.93733 | 1.223955 |
| 48 | 44.892489 | 0.705762 | 0.921576 |
| 49 | 50.077517 | 0.766897 | 1.001405 |
| 50 | 50.077517 | 0.766897 | 1.001405 |

TABLE 3

(DESIGN DATA for FIG. 7)

| SURFACE | RADII | THICKNESSES | GLASSES | DIAMETER |
|---|---|---|---|---|
| 1 | 0.000000 | 0.000000 | AIR | 64.385 |
| 2 | 345.073757 | 9.998854 | SIO2V | 68.260 |
| 3 | 157.409322 | 49.701121 | AIR | 69.507 |
| 4 | −122.244531 | 52.029367 | SIO2V | 73.843 |
| 5 | −199.261606 | 7.652028 | AIR | 102.294 |
| 6 | −568.903701 | 44.561989 | SIO2V | 116.138 |
| 7 | −232.283434 | 1.408075 | AIR | 124.840 |
| 8 | −2953.846302 | 38.798867 | SIO2V | 136.203 |
| 9 | −315.908103 | 2.491849 | AIR | 138.421 |
| 10 | 861.472293 | 39.737967 | SIO2V | 142.180 |
| 11 | −572.292490 | 1.000146 | AIR | 142.095 |
| 12 | 365.071260 | 37.306671 | SIO2V | 134.826 |
| 13 | −5863.202081 | 12.821175 | AIR | 132.380 |
| 14 | 224.229259 | 11.028244 | SIO2V | 113.576 |
| 15 | 175.995309 | 16.598766 | AIR | 106.108 |
| 16 | 250.203130 | 39.358554 | SIO2V | 104.755 |
| 17 | −802.840033 | 26.807982 | AIR | 100.942 |
| 18 | −366.621868 | 10.027110 | SIO2V | 80.564 |
| 19 | −361.186777 | 5.350603 | AIR | 76.667 |
| 20 | 1057.722394 | 18.501287 | SIO2V | 66.182 |
| 21 | 164.683932 | 18.680931 | AIR | 54.842 |
| 22 | −460.473682 | 10.867772 | SIO2V | 51.724 |
| 23 | 748.912892 | 7.757540 | AIR | 47.985 |
| 24 | 0.000000 | 0.000000 | AIR | 45.788 |
| 25 | 0.000000 | 7.757540 | AIR | 45.788 |
| 26 | −748.912892 | 10.867772 | SIO2V | 47.985 |
| 27 | 460.473682 | 18.680931 | AIR | 51.724 |
| 28 | −164.683932 | 18.501287 | SIO2V | 54.842 |
| 29 | −1057.722394 | 5.350603 | AIR | 66.183 |
| 30 | 361.186777 | 10.027110 | SIO2V | 76.667 |

TABLE 3-continued (DESIGN DATA for FIG. 7)

| SURFACE | RADII | THICKNESSES | GLASSES | DIAMETER |
|---|---|---|---|---|
| 31 | 366.621868 | 26.807982 | AIR | 80.565 |
| 32 | 802.840033 | 39.358554 | SIO2V | 100.942 |
| 33 | -250.203130 | 16.598766 | AIR | 104.755 |
| 34 | -175.995309 | 11.028244 | SIO2V | 106.108 |
| 35 | -224.229259 | 12.821175 | AIR | 113.577 |
| 36 | 5863.202081 | 37.306671 | SIO2V | 132.381 |
| 37 | -365.071260 | 1.000146 | AIR | 134.826 |
| 38 | 572.292490 | 39.737967 | SIO2V | 142.095 |
| 39 | -861.472293 | 2.491849 | AIR | 142.181 |
| 40 | 315.908103 | 38.798867 | SIO2V | 138.421 |
| 41 | 2953.846302 | 1.408075 | AIR | 136.203 |
| 42 | 232.283434 | 44.561989 | SIO2V | 124.841 |
| 43 | 568.903701 | 7.652028 | AIR | 116.139 |
| 44 | 199.261606 | 52.029367 | SIO2V | 102.295 |
| 45 | 122.244531 | 49.701121 | AIR | 73.844 |
| 46 | -157.409322 | 9.998854 | SIO2V | 69.507 |
| 47 | -345.073757 | 37.512977 | AIR | 68.260 |
| 48 | 0.000000 | 0.000000 | AIR | 50.000 |

TABLE 4a (ASPHERIC CONSTANTS for FIG. 7)

| | SURFACE | | | |
|---|---|---|---|---|
| | 2 | 19 | 30 | 47 |
| K | 0 | 0 | 0 | 0 |
| C1 | 1.635346e-07 | 4.393822e-08 | -4.393822e-08 | -1.635346e-07 |
| C2 | 2.980756e-13 | -1.559047e-12 | 1.559047e-12 | -2.980756e-13 |
| C3 | -8.385352e-16 | 5.155370e-17 | -5.155370e-17 | 8.385352e-16 |
| C4 | 3.330405e-20 | -1.604317e-21 | 1.604317e-21 | -3.330405e-20 |
| C5 | 4.154983e-24 | -6.843003e-26 | 6.843003e-26 | -4.154983e-24 |
| C6 | -3.137835e-28 | 8.771933e-30 | -8.771933e-30 | 3.137835e-28 |

TABLE 4b (Values $\sin(\sigma_0)$, $\sigma_{max}$, $\sin(\sigma_{max})$ and $\sin(\sigma_{max})/\sin(\sigma_0)$ for FIG. 7)
$\sin(\sigma_0) = 0.3$

| SURFACE | $\sigma_{max}$ | $\sin(\sigma_{max})$ | $\sin(\sigma_{max})/\sin(\sigma_0)$ |
|---|---|---|---|
| 1 | 20.980777 | 0.358045 | 1.193482 |
| 2 | 16.032073 | 0.276167 | 0.920558 |
| 3 | 26.493082 | 0.446078 | 1.486925 |
| 4 | 30.349565 | 0.505261 | 1.684203 |
| 5 | 30.04742 | 0.500703 | 1.669011 |
| 6 | 23.365266 | 0.39658 | 1.321935 |
| 7 | 18.147543 | 0.311456 | 1.038187 |
| 8 | 12.50458 | 0.216511 | 0.721705 |
| 9 | 13.770404 | 0.238025 | 0.793416 |
| 10 | 8.560585 | 0.148851 | 0.496169 |
| 11 | 12.586824 | 0.217912 | 0.726375 |
| 12 | 13.738015 | 0.237476 | 0.791586 |
| 13 | 22.584641 | 0.384037 | 1.280124 |
| 14 | 25.413533 | 0.429137 | 1.430456 |
| 15 | 18.683471 | 0.320331 | 1.067769 |
| 16 | 20.867881 | 0.356204 | 1.187347 |
| 17 | 40.078208 | 0.643817 | 2.146056 |
| 18 | 17.979781 | 0.308673 | 1.028909 |
| 19 | 36.053092 | 0.58852 | 1.961732 |
| 20 | 23.703628 | 0.401995 | 1.339982 |
| 21 | 26.096703 | 0.439875 | 1.466251 |
| 22 | 13.713072 | 0.237053 | 0.790176 |
| 23 | 20.650346 | 0.352654 | 1.175514 |
| 24 | 20.650346 | 0.352654 | 1.175514 |
| 25 | 20.650346 | 0.352654 | 1.175514 |

TABLE 4b-continued (Values $\sin(\sigma_0)$, $\sigma_{max}$, $\sin(\sigma_{max})$ and $\sin(\sigma_{max})/\sin(\sigma_0)$ for FIG. 7)
$\sin(\sigma_0) = 0.3$

| SURFACE | $\sigma_{max}$ | $\sin(\sigma_{max})$ | $\sin(\sigma_{max})/\sin(\sigma_0)$ |
|---|---|---|---|
| 26 | 13.713169 | 0.237055 | 0.790182 |
| 27 | 26.096876 | 0.439878 | 1.46626 |
| 28 | 23.703746 | 0.401996 | 1.339988 |
| 29 | 36.053292 | 0.588522 | 1.961742 |
| 30 | 17.979876 | 0.308674 | 1.028914 |
| 31 | 40.07847 | 0.64382 | 2.146068 |
| 32 | 20.867993 | 0.356206 | 1.187353 |
| 33 | 18.683592 | 0.320333 | 1.067775 |
| 34 | 25.413533 | 0.429139 | 1.430462 |
| 35 | 22.584776 | 0.384039 | 1.280131 |
| 36 | 13.738094 | 0.237477 | 0.791591 |
| 37 | 12.58674 | 0.217911 | 0.72637 |
| 38 | 8.560548 | 0.14885 | 0.496167 |
| 39 | 13.770363 | 0.238024 | 0.793414 |
| 40 | 12.504641 | 0.216512 | 0.721708 |
| 41 | 18.147631 | 0.311458 | 1.038192 |
| 42 | 23.365383 | 0.396582 | 1.321941 |
| 43 | 30.04757 | 0.500705 | 1.669018 |
| 44 | 30.349716 | 0.505263 | 1.68421 |
| 45 | 26.493216 | 0.44608 | 1.486932 |
| 46 | 16.032038 | 0.276167 | 0.920556 |
| 47 | 20.980777 | 0.358045 | 1.193482 |
| 48 | 20.980777 | 0.358045 | 1.193482 |

TABLE 5

(DESIGN DATA for FIG. 8)

| SURFACE | RADII | THICKNESSES | GLASSES | DIAMETER |
|---|---|---|---|---|
| 1 | 0.000000 | 0.000000 | AIR | 43.498 |
| 2 | -110.206131 | 9.995109 | SIO2V | 38.299 |
| 3 | 602.886980 | 32.586560 | AIR | 49.428 |
| 4 | -174.780467 | 25.227256 | SIO2V | 73.812 |
| 5 | -128.362443 | 0.998338 | AIR | 84.320 |
| 6 | -206.429154 | 41.325957 | SIO2V | 95.205 |
| 7 | -126.363749 | 0.998305 | AIR | 104.003 |
| 8 | -944.270193 | 39.835037 | SIO2V | 134.040 |
| 9 | -263.024205 | 0.997852 | AIR | 138.462 |
| 10 | -677.420151 | 52.366344 | SIO2V | 146.982 |
| 11 | -221.621713 | 63.513254 | AIR | 150.022 |
| 12 | 256.322466 | 61.426348 | SIO2V | 150.005 |
| 13 | 5820.404257 | 0.995348 | AIR | 146.275 |
| 14 | 263.146947 | 12.710594 | SIO2V | 133.122 |
| 15 | 148.054990 | 37.362299 | AIR | 117.582 |
| 16 | 286.148841 | 43.991383 | SIO2V | 117.227 |
| 17 | -765.188221 | 0.994643 | AIR | 115.104 |
| 18 | 703.421400 | 9.974056 | SIO2V | 106.996 |
| 19 | 170.593640 | 40.183067 | AIR | 96.312 |
| 20 | -718.344540 | 26.720379 | SIO2V | 95.648 |
| 21 | -10582.040304 | 4.587883 | AIR | 93.824 |
| 22 | 0.000000 | 0.000000 | AIR | 93.362 |
| 23 | 0.000000 | 4.587883 | AIR | 93.362 |
| 24 | 10582.040304 | 26.720379 | SIO2V | 93.824 |
| 25 | 718.344540 | 40.183067 | AIR | 95.647 |
| 26 | -170.593640 | 9.974056 | SIO2V | 96.311 |
| 27 | -703.421400 | 0.994643 | AIR | 106.994 |
| 28 | 765.188221 | 43.991383 | SIO2V | 115.102 |
| 29 | -286.148841 | 37.362299 | AIR | 117.225 |
| 30 | -148.054990 | 12.710594 | SIO2V | 117.580 |
| 31 | -263.146947 | 0.995348 | AIR | 133.119 |
| 32 | -5820.404257 | 61.426348 | SIO2V | 146.271 |
| 33 | -256.322466 | 63.513254 | AIR | 150.002 |
| 34 | 221.621713 | 52.366344 | SIO2V | 150.017 |
| 35 | 677.420151 | 0.997852 | AIR | 146.976 |
| 36 | 263.024205 | 39.835037 | SIO2V | 138.456 |
| 37 | 944.270193 | 0.998305 | AIR | 134.033 |
| 38 | 126.363749 | 41.325957 | SIO2V | 104.000 |

TABLE 5-continued (DESIGN DATA for FIG. 8)

| SURFACE | RADII | THICKNESSES | GLASSES | DIAMETER |
|---|---|---|---|---|
| 39 | 206.429154 | 0.998338 | AIR | 95.201 |
| 40 | 128.362443 | 25.227256 | SIO2V | 84.318 |
| 41 | 174.780467 | 32.586560 | AIR | 73.809 |
| 42 | −602.886980 | 9.995109 | SIO2V | 49.424 |
| 43 | 110.206131 | 37.151441 | AIR | 38.296 |
| 44 | 0.000000 | 0.000000 | AIR | 15.000 |

TABLE 6a (ASPHERIC CONSTANTS for FIG. 8)

| | Sur. | | | |
|---|---|---|---|---|
| | 2 | 13 | 32 | 43 |
| K | 0 | 0 | 0 | 0 |
| C1 | −1.104035e−07 | 2.075608e−09 | −2.075608e−09 | 1.104035e−07 |
| C2 | 7.594942e−11 | −8.718294e−14 | 8.718294e−14 | −7.594942e−11 |
| C3 | 1.267432e−14 | 8.999931e−19 | −8.999931e−19 | −1.267432e−14 |
| C4 | 5.960824e−18 | 2.616878e−23 | −2.616878e−23 | −5.960824e−18 |
| C5 | −4.276279e−22 | −4.473962e−29 | 4.473962e−29 | 4.276279e−22 |
| C6 | −4.805888e−25 | 0.000000e+00 | 0.000000e+00 | 4.805888e−25 |

TABLE 6b (Values $\sin(\sigma_0)$, $\sigma_{max}$, $\sin(\sigma_{max})$ and $\sin(\sigma_{max})/\sin(\sigma_0)$ for FIG. 8)
$\sin(\sigma_0) = 0.6$

| SURFACE | $\sigma_{max}$ | $\sin(\sigma_{max})$ | $\sin(\sigma_{max})/\sin(\sigma_0)$ |
|---|---|---|---|
| 1 | 37.496288 | 0.608695 | 1.014491 |
| 2 | 30.619845 | 0.509326 | 0.848877 |
| 3 | 59.774323 | 0.864034 | 1.440056 |
| 4 | 46.425105 | 0.724457 | 1.207429 |
| 5 | 49.449616 | 0.759818 | 1.266363 |
| 6 | 41.342567 | 0.660544 | 1.100906 |
| 7 | 33.127799 | 0.546494 | 0.910823 |
| 8 | 23.851118 | 0.40435 | 0.673917 |
| 9 | 19.356152 | 0.33143 | 0.552383 |
| 10 | 16.897909 | 0.290659 | 0.484432 |
| 11 | 5.363969 | 0.093479 | 0.155799 |
| 12 | 13.80038 | 0.238533 | 0.397555 |
| 13 | 20.643042 | 0.352535 | 0.587558 |
| 14 | 24.162933 | 0.409322 | 0.682203 |
| 15 | 5.265192 | 0.091763 | 0.152938 |
| 16 | 11.792697 | 0.204365 | 0.340609 |
| 17 | 24.385146 | 0.412857 | 0.688095 |
| 18 | 18.693109 | 0.32049 | 0.53415 |
| 19 | 9.423826 | 0.163731 | 0.272886 |
| 20 | 3.697937 | 0.064494 | 0.107491 |
| 21 | 5.778886 | 0.100687 | 0.167811 |
| 22 | 5.778886 | 0.100687 | 0.167811 |
| 23 | 5.778886 | 0.100687 | 0.167811 |
| 24 | 3.697933 | 0.064494 | 0.107491 |
| 25 | 9.422589 | 0.16371 | 0.27285 |
| 26 | 18.692274 | 0.320476 | 0.534127 |
| 27 | 24.383867 | 0.412837 | 0.688061 |
| 28 | 11.792024 | 0.204354 | 0.34059 |
| 29 | 5.265224 | 0.091764 | 0.152939 |
| 30 | 24.161967 | 0.409306 | 0.682177 |
| 31 | 20.641908 | 0.352516 | 0.587527 |
| 32 | 13.799637 | 0.23852 | 0.397534 |
| 33 | 5.364627 | 0.093491 | 0.155818 |
| 34 | 16.897321 | 0.290649 | 0.484415 |
| 35 | 19.355533 | 0.33142 | 0.552366 |
| 36 | 23.850235 | 0.404336 | 0.673894 |
| 37 | 33.12658 | 0.546476 | 0.910794 |

TABLE 6b-continued (Values $\sin(\sigma_0)$, $\sigma_{max}$, $\sin(\sigma_{max})$ and $\sin(\sigma_{max})/\sin(\sigma_0)$ for FIG. 8)
$\sin(\sigma_0) = 0.6$

| SURFACE | $\sigma_{max}$ | $\sin(\sigma_{max})$ | $\sin(\sigma_{max})/\sin(\sigma_0)$ |
|---|---|---|---|
| 38 | 41.340985 | 0.660523 | 1.100872 |
| 39 | 49.447799 | 0.759797 | 1.266329 |
| 40 | 46.423359 | 0.724436 | 1.207394 |
| 41 | 59.772094 | 0.864014 | 1.440024 |
| 42 | 30.61934 | 0.509318 | 0.848864 |
| 43 | 37.496524 | 0.608698 | 1.014497 |
| 44 | 37.496524 | 0.608698 | 1.014497 |

TABLE 7

(DESIGN DATA for FIG. 9)

| SURFACE | RADII | THICKNESSES | GLASSES | DIAMETER |
|---|---|---|---|---|
| 1 | 0.000000 | −5.341329 | AIR | 59.950 |
| 2 | 299.070524 | 9.999009 | SIO2V | 61.031 |
| 3 | 128.974788 | 32.289908 | AIR | 62.135 |
| 4 | −173.544932 | 46.025186 | SIO2V | 64.265 |
| 5 | 12309.595011 | 14.046499 | AIR | 92.614 |
| 6 | −483.608290 | 36.247841 | SIO2V | 96.362 |
| 7 | −318.245849 | 0.999703 | AIR | 111.852 |
| 8 | −659.889358 | 32.441029 | SIO2V | 119.710 |
| 9 | −250.111461 | 1.018201 | AIR | 124.851 |
| 10 | −1047.358535 | 47.729697 | SIO2V | 137.060 |
| 11 | −234.579432 | 3.213912 | AIR | 140.510 |
| 12 | 911.507519 | 58.745717 | SIO2V | 149.668 |
| 13 | −327.437653 | 2.073132 | AIR | 149.991 |
| 14 | 304.595360 | 22.725962 | SIO2V | 131.912 |
| 15 | 485.421675 | 1.040651 | AIR | 128.522 |
| 16 | 197.221426 | 29.318841 | SIO2V | 119.484 |
| 17 | 270.755969 | 41.544772 | AIR | 112.667 |
| 18 | −588.786019 | 24.261200 | SIO2V | 109.070 |
| 19 | −196.170023 | 0.999085 | AIR | 106.788 |
| 20 | −657.069925 | 19.102272 | SIO2V | 90.642 |
| 21 | 182.514870 | 37.989240 | AIR | 75.090 |
| 22 | −161.495001 | 9.999701 | SIO2V | 73.759 |
| 23 | 180.130604 | 11.232568 | AIR | 73.717 |
| 24 | 293.361910 | 10.000018 | SIO2V | 74.928 |
| 25 | 224.403691 | 42.529296 | AIR | 76.180 |
| 26 | 0.000000 | 29.092329 | SIO2V | 87.435 |
| 27 | −258.425147 | 13.722921 | AIR | 90.453 |
| 28 | −553.437071 | 10.055318 | SIO2V | 94.043 |
| 29 | 1718.800624 | 42.001421 | AIR | 97.517 |
| 30 | 0.000000 | 2.659300 | AIR | 109.374 |
| 31 | 0.000000 | 17.554099 | AIR | 110.899 |
| 32 | −577.752494 | 26.202031 | SIO2V | 114.405 |
| 33 | −268.536580 | 37.243141 | AIR | 118.669 |
| 34 | −373.594070 | 43.678689 | SIO2V | 134.266 |
| 35 | −192.061692 | 0.998733 | AIR | 138.153 |
| 36 | 286.654647 | 44.175924 | SIO2V | 147.250 |
| 37 | 1627.982099 | 0.999097 | AIR | 145.713 |
| 38 | 199.943323 | 48.106011 | SIO2V | 136.527 |
| 39 | 562.883307 | 2.334523 | AIR | 132.273 |
| 40 | 198.974190 | 57.415101 | SIO2V | 118.393 |
| 41 | 356.393341 | 17.889262 | AIR | 98.745 |
| 42 | 0.000000 | 111.686939 | SIO2V | 95.296 |
| 43 | 109.843628 | 7.354831 | AIR | 40.312 |
| 44 | 128.058533 | 16.006724 | SIO2V | 37.641 |
| 45 | 0.000000 | 10.594719 | AIR | 33.221 |
| 46 | 0.000000 | 0.000000 | AIR | 25.000 |

TABLE 8a (ASPHERIC CONSTANTS for FIG. 9)

| Sur | | | | |
|---|---|---|---|---|
| | 2 | 19 | 24 | 41 |
| K  | 0 | 0 | 0 | 0 |
| C1 | 1.827036e−07 | 6.415216e−08 | −2.800645e−08 | 3.478343e−09 |
| C2 | −5.671165e−12 | −1.281881e−12 | 6.849816e−13 | −3.566014e−13 |
| C3 | 2.603509e−16 | 5.622084e−17 | −2.872650e−17 | −4.680126e−18 |
| C4 | 2.803459e−20 | −1.605043e−21 | −4.172581e−22 | −2.291221e−22 |
| C5 | −1.250454e−24 | 4.028615e−26 | −1.716142e−25 | 2.754912e−27 |
| C6 | −1.716678e−28 | −3.801309e−31 | −2.725229e−29 | −2.307098e−31 |

TABLE 8b (Values $\sin(\sigma_0)$, $\sigma_{max}$, $\sin(\sigma_{max})$ and $\sin(\sigma_{max})/\sin(\sigma_0)$ zu FIG. 9)
$\sin(\sigma_0) = 0.3$

| SURFACE | $\sigma_{max}$ | $\sin(\sigma_{max})$ | $\sin(\sigma_{max})/\sin(\sigma_0)$ |
|---|---|---|---|
| 1  | 18.751111 | 0.321449 | 1.071496 |
| 2  | 14.915199 | 0.257382 | 0.857939 |
| 3  | 28.046568 | 0.470176 | 1.567254 |
| 4  | 25.773856 | 0.434808 | 1.449361 |
| 5  | 43.137055 | 0.68373  | 2.279099 |
| 6  | 31.135019 | 0.517043 | 1.723476 |
| 7  | 37.194781 | 0.604511 | 2.015038 |
| 8  | 27.208575 | 0.457219 | 1.524062 |
| 9  | 25.671241 | 0.433195 | 1.443983 |
| 10 | 19.033118 | 0.326105 | 1.087018 |
| 11 | 11.299271 | 0.195928 | 0.653093 |
| 12 | 7.579809  | 0.131903 | 0.439677 |
| 13 | 14.786447 | 0.25521  | 0.850699 |
| 14 | 18.719067 | 0.320919 | 1.06973 |
| 15 | 20.611085 | 0.352013 | 1.173376 |
| 16 | 26.693437 | 0.449204 | 1.497348 |
| 17 | 27.874205 | 0.467519 | 1.558397 |
| 18 | 12.857795 | 0.222526 | 0.741752 |
| 19 | 40.108411 | 0.64422  | 2.1474 |
| 20 | 20.522439 | 0.350564 | 1.168548 |
| 21 | 18.40135  | 0.315662 | 1.052208 |
| 22 | 14.104693 | 0.243687 | 0.812291 |
| 23 | 29.823058 | 0.49731  | 1.657699 |
| 24 | 15.510414 | 0.267406 | 0.891353 |
| 25 | 32.825405 | 0.542067 | 1.806889 |
| 26 | 20.323042 | 0.347303 | 1.157677 |
| 27 | 22.493914 | 0.382575 | 1.275249 |
| 28 | 17.376007 | 0.298633 | 0.995442 |
| 29 | 29.833082 | 0.497462 | 1.658205 |
| 30 | 29.833082 | 0.497462 | 1.658205 |
| 31 | 29.833082 | 0.497462 | 1.658205 |
| 32 | 23.096337 | 0.392267 | 1.307558 |
| 33 | 21.337845 | 0.363856 | 1.212854 |
| 34 | 21.239002 | 0.362249 | 1.207496 |
| 35 | 7.075173  | 0.123168 | 0.41056 |
| 36 | 13.244947 | 0.229108 | 0.763693 |
| 37 | 18.573975 | 0.31852  | 1.061732 |
| 38 | 23.042112 | 0.391397 | 1.304656 |
| 39 | 31.023964 | 0.515383 | 1.717943 |
| 40 | 31.351589 | 0.520274 | 1.734248 |
| 41 | 40.773739 | 0.653058 | 2.176859 |
| 42 | 24.735264 | 0.418415 | 1.394715 |
| 43 | 41.893946 | 0.667738 | 2.225793 |
| 44 | 23.127512 | 0.392768 | 1.309226 |
| 45 | 37.809891 | 0.613028 | 2.043427 |
| 46 | 37.809891 | 0.613028 | 2.043427 |

The invention claimed is:

1. An imaging system for imaging a mask which can be positioned in an object plane of the imaging system on to a photosensitive layer which can be positioned in an image plane of the imaging system, the imaging system comprising:
   an object plane-side subsystem which produces a first intermediate image with an object plane-side imaging scale $\beta_o$;
   at least one further subsystem which produces a further intermediate image between the first intermediate image and the image plane; and
   an image plane-side subsystem which images the further intermediate image into the image plane with an image plane-side imaging scale $\beta_i$;
   wherein the condition $0.75 \leq \beta_o * \beta_i \leq 1.25$ is satisfied, and all subsystems are arranged on a common, non-folded optical axis.

2. An imaging system as set forth in claim 1 wherein the condition $0.85 \leq \beta_o * \beta_i \leq 1.15$ is fulfilled.

3. An imaging system as set forth in claim 1 wherein for a total imaging scale $\beta$ the condition $0.75 \leq \beta \leq 1.25$ is fulfilled.

4. An imaging system as set forth in claim 1 wherein the further subsystem has at least one concave mirror.

5. An imaging system as set forth in claim 1 wherein the imaging system is substantially telecentric at the image plane side.

6. An imaging system as set forth in claim 1 wherein the imaging system is substantially telecentric at the object plane side.

7. An imaging system as set forth in claim 1 wherein the object plane and the image plane are arranged in mutually parallel relationship.

8. An imaging system as set forth in claim 1 wherein the further subsystem images the first intermediate image into the second intermediate image.

9. An imaging system as set forth in claim 1 wherein the image-side numerical aperture (NA) is greater than 0.6.

10. A microlithographic projection exposure apparatus for the production of microstructured components comprising an imaging system as set forth in claim 1.

11. A process for the microlithographic production of microstructured components comprising the following steps:
   providing a substrate to which a layer of a photosensitive material is at least region-wise applied;
   providing a mask which has structures to be imaged;
   providing a projection exposure apparatus having an imaging system as set forth in claim 1; and
   projecting at least a part of the mask on to a region of the layer by means of the projection exposure apparatus.

12. A process for wafer level packaging in which a plurality of semiconductor chips produced on a wafer are provided with electrical contacts in a lithography process, wherein an imaging system as set forth in claim 1 is used in the lithography process.

13. An imaging system for imaging a mask which can be positioned in an object plane of the imaging system on to a photosensitive layer which can be positioned in an image plane of the imaging system, the imaging system comprising:
   a first dioptric group in front of a pupil plane of overall positive refractive power;
   at least one second dioptric group after a pupil plane of overall positive refractive power; and
   an imaging scale $\beta'$, for which the condition $0.50 \leq \beta' \leq 1.50$ is fulfilled;
   wherein the imaging system is of a telecentric configuration at the object plane side and the image plane side; and
   wherein there is provided at least one aspheric lens surface, the imaging system has a numerical aperture having a value larger than 0.15, and an operating wavelength of the imaging system is less than 300 nm.

14. An imaging system as set forth in claim 13 wherein the condition $0.80 \leq \beta' \leq 1.20$ is fulfilled for the imaging scale $\beta'$.

15. An imaging system as set forth in claim 13 wherein the image-side numerical aperture (NA) is greater than 0.30.

16. An imaging system as set forth in claim 13 wherein the imaging system is of a substantially mirror image-symmetrical configuration in relation to a pupil plane of the imaging system.

17. An imaging system as set forth in claim 13 wherein in the image plane the imaging system produces an image field of a diameter of at least 30 mm.

18. An imaging system as set forth in claim 13 wherein an intermediate space between the image plane-side last optical element and the image plane and/or an intermediate space between the object plane-side last optical element and the object plane is filled with an immersion medium which is of a refractive index of greater than one.

19. An imaging system as set forth in claim 13 wherein the imaging system is designed for a wavelength of 248 nm.

20. An imaging system according to claim 13, wherein there is provided at least on aspheric lens surface for which the condition $|\sin\sigma_{max}/\sin\sigma_o| > 0.4$ is fulfilled, wherein $\sigma_{max}$ gives the maximum angle of inclination of the rays which emanate from the lens surface to the next lens surface and wherein $\sigma_o$ gives the angle of inclination of that edge ray which emanates from the object point on the optical axis to the optical axis.

21. An imaging system for imaging a mask which can be positioned in an object plane of the imaging system on to a photosensitive layer which can be positioned in an image plane of the imaging system, the imaging system comprising:

an object plane-side subsystem which produces a first intermediate image with an object plane-side imaging scale $\beta_o$;

at least one further subsystem which produces a further intermediate image between the first intermediate image and the image plane; and an image plane-side subsystem which images the further intermediate image into the image plane with an image plane-side imaging scale $\beta_i$;

wherein the condition $0.75 \leq \beta_o * \beta_i \leq 1.25$ is satisfied, and the further subsystem comprises two concave mirrors.

22. An imaging system for imaging a mask which can be positioned in an object plane of the imaging system on to a photosensitive layer which can be positioned in an image plane of the imaging system, the imaging system comprising:

an object plane-side subsystem which produces a first intermediate image with an object plane-side imaging scale $\beta_o$;

at least one further subsystem which produces a further intermediate image between the first intermediate image and the image plane; and an image plane-side subsystem which images the further intermediate image into the image plane with an image plane-side imaging scale $\beta_i$;

wherein the condition $0.75 \leq \beta_o * \beta_{i\ 1.25}$ is satisfied, and the object plane-side subsystem and the image plane-side subsystem are purely refractive.

* * * * *

UNITED STATES PATENT AND TRADEMARK OFFICE
CERTIFICATE OF CORRECTION

| | | |
|---|---|---|
| PATENT NO. | : 7,359,036 B2 | |
| APPLICATION NO. | : 11/441482 | |
| DATED | : April 15, 2008 | |
| INVENTOR(S) | : Dodoc | |

It is certified that error appears in the above-identified patent and that said Letters Patent is hereby corrected as shown below:

On Sheet 10 of 12, in Fig. 10, delete "0,2, 0,4, 0,6 0,8 1,2 1,4" and insert -- 0.2, 0.4 0.6 0.8 1.2 1.4 --, therefor.

On Sheet 10 of 12, in Fig. 11, delete "0,5, 1,5, 2,5" and insert -- 0.5, 1.5, 2.5 --, therefor.

Figure 12:
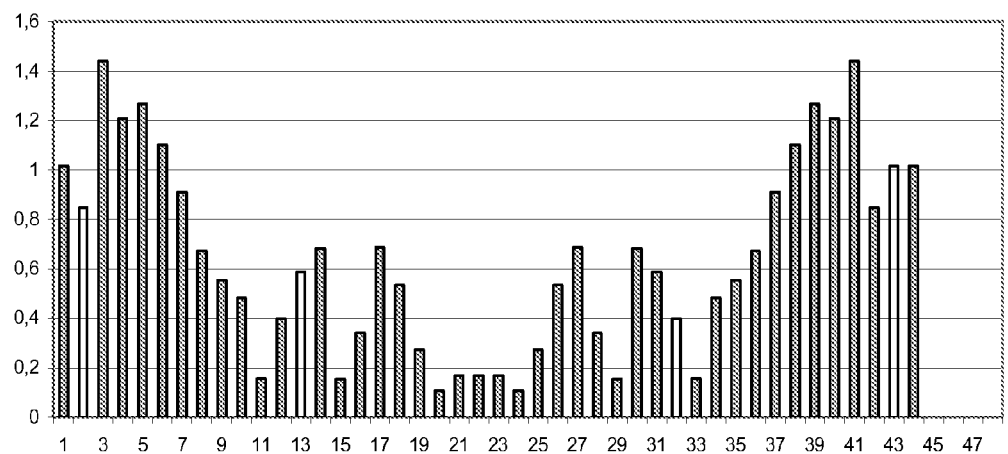

On Sheet 11 of 12, in Fig. 12, delete "0,2, 0,4, 0,6 0,8 1,2 1,4 1,6" and insert -- 0.2, 0.4 0.6 0.8 1.2 1.4 1.6 --, therefor.

Figure 13:
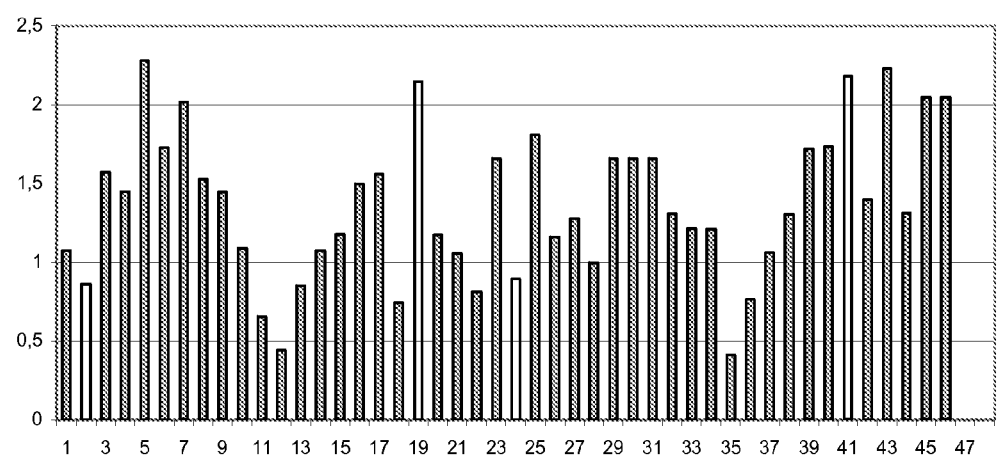

On Sheet 11 of 12, in Fig. 13, delete "0,5, 1,5, 2,5" and insert -- 0.5, 1.5, 2.5 --, therefor.

In column 1, line 4, below "Title" insert -- CROSS REFERENCE TO RELATED APPLICATIONS Under 35 U.S.C. § 119, this application claims priority to German Patent Application No. 10 2005 024 290.1, filed May 27, 2005, the contents of which are hereby incorporated by reference in its entirety. --.

In column 6, line 23, delete "FIG." and insert -- FIGS. --, therefor.

In column 6, line 30, delete "FIG." and insert -- FIGS. --, therefor.

In column 6, line 34, delete "FIG." and insert -- FIGS. --, therefor.

In column 6, line 56, delete "$sin(\sigma_{max}/sin(\sigma_o)$" and insert -- $sin(\sigma_{max})/sin(\sigma_o)$ --, therefor.

In column 7, line 42, delete "IM2" and insert -- IMI2 --, therefor.

In column 7, line 48, delete "IM2" and insert -- IMI2 --, therefor.

In column 12, line 43, delete "$sin(\sigma_{max})/sin\ \sigma_o)$" and insert -- $sin(\sigma_{max})/sin(\sigma_o)$ --, therefor.

UNITED STATES PATENT AND TRADEMARK OFFICE
CERTIFICATE OF CORRECTION

PATENT NO. : 7,359,036 B2
APPLICATION NO. : 11/441482
DATED : April 15, 2008
INVENTOR(S) : Dodoc It is certified that error appears in the above-identified patent and that said Letters Patent is hereby corrected as shown below:

In column 21, line 5, delete "Sur" and insert -- Sur. --, therefor.

In column 21, line 19, before "FIG. 9" delete "zu" and insert -- for --, therefor.

In column 24, line 30, in Claim 22, delete "$0.75 \leq \beta o * \beta_{i\ 1.25}$" and insert -- $0.75 \leq \beta o * \beta_i \leq 1.25$ --, therefor.

Signed and Sealed this

Fifth Day of August, 2008

JON W. DUDAS
*Director of the United States Patent and Trademark Office*